(12) United States Patent
Kim et al.

(10) Patent No.: US 11,990,570 B2
(45) Date of Patent: May 21, 2024

(54) WHITE LIGHT EMITTING DEVICE AND LIGHTING APPARATUS

(71) Applicant: SAMSUNG ELECTRONICS CO., LTD., Suwon-si (KR)

(72) Inventors: Seongmin Kim, Seongnam-si (KR); Chohui Kim, Hwaseong-si (KR); Jeongeun Yun, Hwaseong-si (KR); Seulgee Lee, Suwon-si (KR); Sungwoo Choi, Suwon-si (KR); Jeongrok Oh, Suwon-si (KR); Chulsoo Yoon, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 339 days.

(21) Appl. No.: 17/185,431

(22) Filed: Feb. 25, 2021

(65) Prior Publication Data
US 2022/0209075 A1    Jun. 30, 2022

(30) Foreign Application Priority Data
Dec. 28, 2020   (KR) .................. 10-2020-0185082

(51) Int. Cl.
    *H01L 33/50*    (2010.01)
(52) U.S. Cl.
    CPC ................. *H01L 33/504* (2013.01)
(58) Field of Classification Search
    CPC .................................................. H01L 33/504
    See application file for complete search history.

(56) References Cited

U.S. PATENT DOCUMENTS

| | | |
|---|---|---|
| 6,372,608 B1 | 4/2002 | Shimoda et al. |
| 6,645,830 B2 | 11/2003 | Shimoda et al. |
| RE38,466 E | 3/2004 | Inoue et al. |
| 6,818,465 B2 | 11/2004 | Biwa et al. |
| 6,818,530 B2 | 11/2004 | Shimoda et al. |
| 6,858,081 B2 | 2/2005 | Biwa et al. |
| 6,967,353 B2 | 11/2005 | Suzuki et al. |
| 7,002,182 B2 | 2/2006 | Okuyama et al. |
| 7,084,420 B2 | 8/2006 | Kim et al. |
| 7,087,932 B2 | 8/2006 | Okuyama et al. |
| 7,154,124 B2 | 12/2006 | Han et al. |
| 7,208,725 B2 | 4/2007 | Sherrer et al. |
| 7,288,758 B2 | 10/2007 | Sherrer et al. |
| 7,319,044 B2 | 1/2008 | Han et al. |

(Continued)

FOREIGN PATENT DOCUMENTS

JP    2020098855 A    6/2020

*Primary Examiner* — Sarah K Salerno
(74) *Attorney, Agent, or Firm* — Sughrue Mion, PLLC

(57) ABSTRACT

A white light emitting device is provided. The white light emitting device includes a blue light emitting diode configured to emit blue light having a peak wavelength in a first range of 440 nm to 455 nm; a first wavelength conversion material, based on being excited by the blue light, emits first light having a peak wavelength in a second range of 535 nm to 550 nm and a full width at half maximum (FWHM) of 60 nm or less; and a second wavelength conversion material, based on being excited by the blue light, emits second light having a peak wavelength in a third range of 620 nm to 660 nm, wherein a melanopic photopic ratio of white light emitted from the white light emitting device is 0.65 or less, and a color rendering index (CRI) of the white light is 80 or more.

15 Claims, 12 Drawing Sheets

(56) References Cited

U.S. PATENT DOCUMENTS

| | | |
|---|---|---|
| 7,501,656 B2 | 3/2009 | Han et al. |
| 7,709,857 B2 | 5/2010 | Kim et al. |
| 7,759,140 B2 | 7/2010 | Lee et al. |
| 7,781,727 B2 | 8/2010 | Sherrer et al. |
| 7,790,482 B2 | 9/2010 | Han et al. |
| 7,940,350 B2 | 5/2011 | Jeong |
| 7,959,312 B2 | 6/2011 | Yoo et al. |
| 7,964,881 B2 | 6/2011 | Choi et al. |
| 7,985,976 B2 | 7/2011 | Choi et al. |
| 7,994,525 B2 | 8/2011 | Lee et al. |
| 8,008,683 B2 | 8/2011 | Choi et al. |
| 8,013,352 B2 | 9/2011 | Lee et al. |
| 8,049,161 B2 | 11/2011 | Sherrer et al. |
| 8,129,711 B2 | 3/2012 | Kang et al. |
| 8,179,938 B2 | 5/2012 | Kim |
| 8,263,987 B2 | 9/2012 | Choi et al. |
| 8,324,646 B2 | 12/2012 | Lee et al. |
| 8,399,944 B2 | 3/2013 | Kwak et al. |
| 8,432,511 B2 | 4/2013 | Jeong |
| 8,459,832 B2 | 6/2013 | Kim |
| 8,502,242 B2 | 8/2013 | Kim |
| 8,536,604 B2 | 9/2013 | Kwak et al. |
| 8,735,931 B2 | 5/2014 | Han et al. |
| 8,766,295 B2 | 7/2014 | Kim |
| 9,410,664 B2 | 8/2016 | Krames et al. |
| 10,324,250 B2 | 6/2019 | Krames et al. |
| 10,632,214 B2 | 4/2020 | David et al. |
| 10,685,941 B1 | 6/2020 | Li et al. |
| 2015/0062892 A1 | 3/2015 | Krames et al. |
| 2018/0338359 A1 | 11/2018 | Soler |
| 2018/0371311 A1* | 12/2018 | Zhu ................ C09K 11/7786 |
| 2019/0097098 A1 | 3/2019 | Fujio et al. |
| 2019/0341531 A1* | 11/2019 | Zhang ............... H01L 25/0753 |
| 2020/0057339 A1 | 2/2020 | Chen et al. |
| 2021/0097943 A1* | 4/2021 | Wyatt ................ H10K 59/351 |

* cited by examiner

I – I'

WHITE LIGHT EMITTING DEVICE AND LIGHTING APPARATUS

CROSS-REFERENCE TO RELATED APPLICATION(S)

This application is based on and claims priority under 35 U.S.C. § 119(a) to Korean Patent Application No. 10-2020-0185082 filed on Dec. 28, 2020 in the Korean Intellectual Property Office, the disclosure of which is incorporated herein by reference in its entirety.

BACKGROUND

Embodiments of the disclosure relate to a white light emitting device and a light emitting diode (LED) lighting apparatus including the same.

In general, a wavelength conversion material such as a phosphor has been used as a material for converting light of a specific wavelength emitted from various light sources into light of a desired wavelength. In particular, such a wavelength conversion material has been widely used for a white light emitting device for various lighting apparatuses as well as for a display such as a liquid crystal display (LCD) backlight, in combination with a semiconductor light emitting diode having excellent light efficiency.

Moreover, the white light emitting device has been generally implemented by applying a plurality of wavelength conversion materials (for example, green and red materials or blue, yellow, and red materials) such as a phosphor to an ultraviolet or blue light emitting diode (LED) chip. Recently, in the field of white lighting, a human-centric LED lighting apparatus and a white light emitting device alike have been increasing in demand.

SUMMARY

Provided is a white light emitting device for human-centric lighting.

Also, provided is a light emitting diode (LED) lighting apparatus for human-centric lighting.

According to an embodiment, there is provided a white light emitting device including: a blue light emitting diode configured to emit blue light having a peak wavelength in a first range of 440 nm to 455 nm; a first wavelength conversion material, based on being excited by the blue light, emits first light having a peak wavelength in a second range of 535 nm to 550 nm and a full width at half maximum (FWHM) of 60 nm or less; and a second wavelength conversion material, based on being excited by the blue light, emits second light having a peak wavelength in a third range of 620 nm to 660 nm, wherein a melanopic photopic ratio of white light emitted from the white light emitting device is 0.65 or less, and a color rendering index (CRI) of the white light is 80 or more.

According to an embodiment, there is provided a white light emitting device including: a blue light emitting diode configured to emit blue light having a peak wavelength in a first range of 440 nm to 455 nm; and a wavelength conversion portion configured to convert a portion of the blue light and combine the converted portion of the blue light and a portion of the blue light with each other to provide white light, wherein the wavelength conversion portion includes a first wavelength conversion material, based on being excited by the blue light, that emits first light having a peak wavelength in a second range of 535 nm to 550 nm, and a second wavelength conversion material, based on being excited by the blue light, that emits second light having a peak wavelength in a third range of 620 nm to 660 nm, in a spectrum of the first light, an intensity of the first light at 480 nm is 2% or less of a peak intensity of the first light, and a melanopic photopic ratio of the white light is 0.65 or less, and a color rendering index (CRI) of the white light is 80 or more.

According to an embodiment, there is provided a white light emitting device including: a blue light emitting diode configured to emit blue light having a peak wavelength in a first range of 440 nm to 455 nm; a first wavelength conversion material, based on being excited by the blue light, emits first light having a peak wavelength in a second range of 535 nm to 550 nm and an FWHM of 60 nm or less; and a second wavelength conversion material, based on being excited by the blue light, emits second light having a peak wavelength in a third range of 620 nm to 660 nm, wherein a melanopic photopic ratio of white light emitted from the white light emitting device is 0.65 or less, and in a spectrum of the white light, an integral value in a band of 440 nm to 460 nm is in a range of 50% to 65% of an integral value in a band of 380 nm to 500 nm, and an integral value in a band of 480 nm to 500 nm is in a range of 26% or less of an integral value in a band of 540 nm to 560 nm.

According to an embodiment, there is provided a light emitting diode (LED) lighting apparatus including: a first LED light source configured to emit first white light having a first melanopic photopic ratio; a second LED light source configured to emit second white light having a second melanopic photopic ratio, the second melanopic photopic ratio being higher than the first melanopic photopic ratio; and a driving control unit configured to control currents applied to the first LED light source and the second LED light source, wherein the first LED light source includes a blue light emitting diode configured to emit blue light having a peak wavelength in a first range of 440 nm to 455 nm, a first wavelength conversion material, based on being excited by the blue light, emits first light having a peak wavelength in a second range of 535 nm to 550 nm and an FWHM of 60 nm or less, and a second wavelength conversion material, based on being excited by the blue light, emits second light having a peak wavelength in a third range of 620 nm to 660 nm.

BRIEF DESCRIPTION OF THE DRAWINGS

The above and other aspects, features, and advantages of the present embodiments will be apparent from the following detailed description, taken in conjunction with the accompanying drawings, in which.

DETAILED DESCRIPTION

Hereinafter, example embodiments will be described in detail with reference to the accompanying drawings.

The expression "at least one of a, b, and c," should be understood as including only a, only b, only c, both a and b, both a and c, both b and c, or all of a, b, and c. The terms such as "first", "second", or the like may be used to modify various elements regardless of order and/or importance, and to simply distinguish one element from another element.

Figure 1:
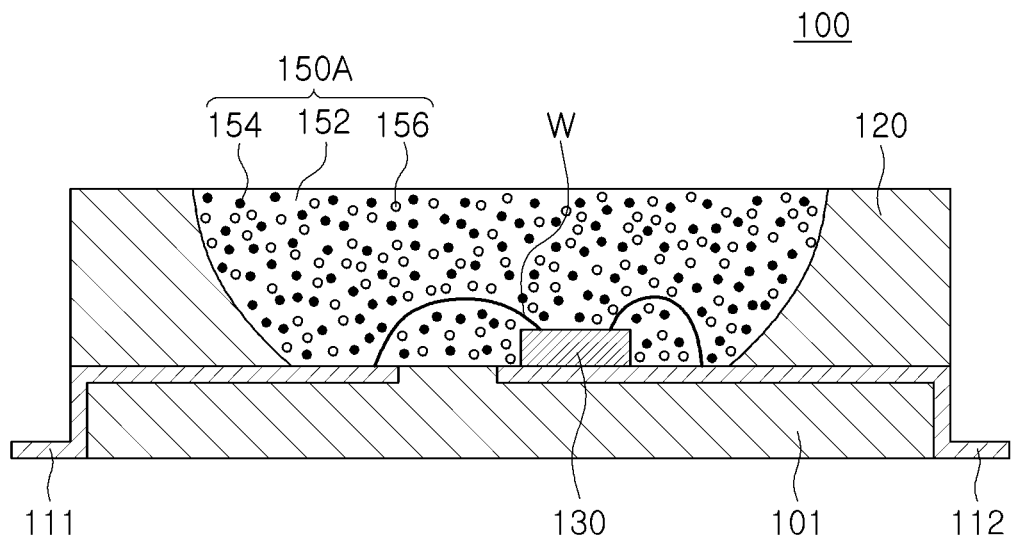
FIG. 1 is a schematic cross-sectional view illustrating a white light emitting device according to an example embodiment.

FIG. 1 is a schematic cross-sectional view illustrating a white light emitting device according to an example embodiment.

Referring to FIG. 1, a white light emitting device 100 according to an embodiment may include a package substrate 101, a blue light emitting diode (LED) 130 disposed on the package substrate 101, and a wavelength conversion portion 150A. The white light emitting device 100 may further include a pair of lead frames 111 and 112 disposed on a portion of the package substrate 101 and electrically connected to the blue LED 130, a sidewall reflection portion 120 having a cup shape, and conductive wires W connecting the blue LED 130 and the lead frames 111 and 112 to each other.

For example, the package substrate 101 may be formed of an opaque resin or a resin having a high reflectivity, and may include a polymer resin of which an injection process is easy and which contains highly reflective powder particles. In addition, the package substrate 101 may be formed of ceramic. In this case, heat may be easily dissipated. In some example embodiments, the package substrate 101 may be a printed circuit board on which wiring patterns formed to substitute the lead frames 111 and 112.

The sidewall reflection portion 120 may be disposed on the package substrate 101 and the lead frames 111 and 112, and form a cavity accommodating the blue LED 130 therein. The sidewall reflection portion 120 may have a cup shape so that reflection efficiency of light is improved, but is not limited thereto. In some example embodiments, the sidewall reflection portion 120 may be configured integrally with the package substrate 101. For example, the sidewall reflection portion 120 and the package substrate 101 may be formed of the same material (for example, a resin containing highly reflective white powder particles) by the same process (for example, injection molding).

The blue LED 130 may include an epitaxial semiconductor layer configured so that blue light is emitted. The blue LED 130 may be configured to emit blue light having a peak wavelength in the range of 440 nm to 455 nm.

The wavelength conversion portion 150A may be disposed on an optical path of the blue LED 130 and include a plurality of wavelength conversion materials 154 and 156 dispersed in a transparent resin 152. The plurality of wavelength conversion materials 154 and 156 may be selectively dispersed in the transparent resin 152 so that light of other wavelengths are converted by excitation of the wavelength conversion materials 154 and 156. For example, the blue light emitted from the blue LED 130 and a blue light portion that is not converted may be combined with each other to ultimately emit desired white light. The transparent resin 152 may be an epoxy resin, a silicone resin, a modified silicone resin, a urethane resin, an oxetane resin, an acrylic resin, a polycarbonate resin, a polyimide resin, and/or combinations thereof. In some example embodiments, instead of dispersing the wavelength conversion materials 154 and 156 in the transparent resin 152, the wavelength conversion materials 154 and 156 may be provided in a form in which they are applied directly to a surface of the blue LED 130 (see FIG. 16).

Figure 2:
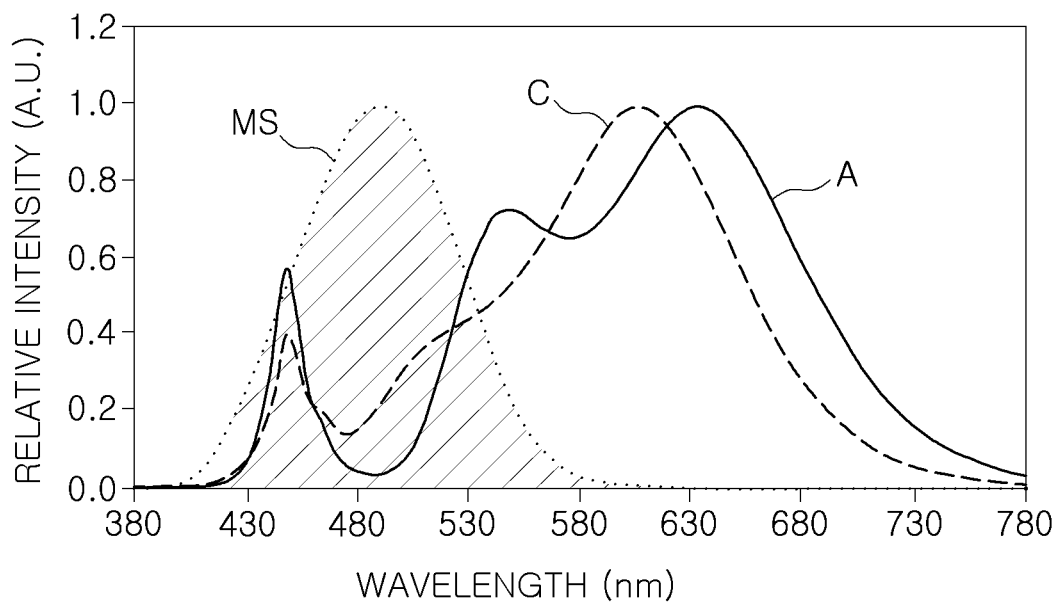
FIG. 2 is a graph illustrating light emission spectra of white light emitted from a white light emitting device according to an example embodiment.

The white light emitting device 100 according to an embodiment may provide human-centric lighting illumination (for example, night lighting illumination) by lowering an intensity in a melanopic sensitivity band in order to optimize circadian rhythms. As illustrated in FIG. 2, the white light emitted from the white light emitting device 100 may have a spectrum A in which a melanopic sensitivity band MS is adjusted. In spectrum A of the white light, a melanopic photopic ratio of the white light may be adjusted to be 0.37 (which is relatively low) by lowering the intensity in the melanopic sensitivity band MS, particularly, a band of about 465 nm to 495 nm.

The secretion of melatonin hormone related to a human biorhythm may be adjusted by adjusting the melanopic sensitivity band MS, particularly, to the band of about 465 nm to 495 nm, in the spectrum of the white light as described above. Accordingly, the white light that may optimize the circadian rhythm based on such adjustment. On the other hand, "C" indicates a spectrum of another white light. The spectrum indicated by "C" may have a light amount relatively higher than that of spectrum "A" in the melanopic sensitivity band MS while having the same correlated color temperature as a correlated color temperature (for example, 2700 K) of the spectrum of the white light indicated by "A". That is, a melanopic photopic ratio of the spectrum of the white light indicated by "C" may be 0.46, which is relatively higher than the melanopic photopic ratio of the spectrum indicated by "A".

The white light according to the one or more embodiments of the disclosure may have a relatively low melanopic photopic ratio. For example, the white light according to the one or more embodiments may have a melanopic photopic (M/P) ratio of 0.65 or less.

Such a melanopic photopic ratio generally tend to increase as a correlated color temperature increases. The white light according to the one or more embodiments may be implemented to have a relatively low melanopic photopic ratio in the range of about 1800 K to 4000 K. For example, the white light may have a melanopic photopic ratio in the range of about 0.1 to 0.65 in the range of about 1800 K to 4000 K.

In some example embodiments, in spite of the selective adjustment of such a specific wavelength band ("MS" in FIG. 2), the white light of the white light emitting device 100 may have a high color rendering index (CRI) of 80 or more. In some example embodiments, the color rendering index of the white light of the white light emitting device 100 may be 80 or more.

In order to adapt to white light of such a condition, the wavelength conversion materials 154 and 156 may be used. The wavelength conversion materials according to an embodiment may include first wavelength conversion materials 154 emitting first light having a peak wavelength in the range of about 535 nm to 550 nm and second wavelength conversion materials 156 emitting second light having a peak wavelength in the range of about 620 nm to 660 nm.

Figure 3:
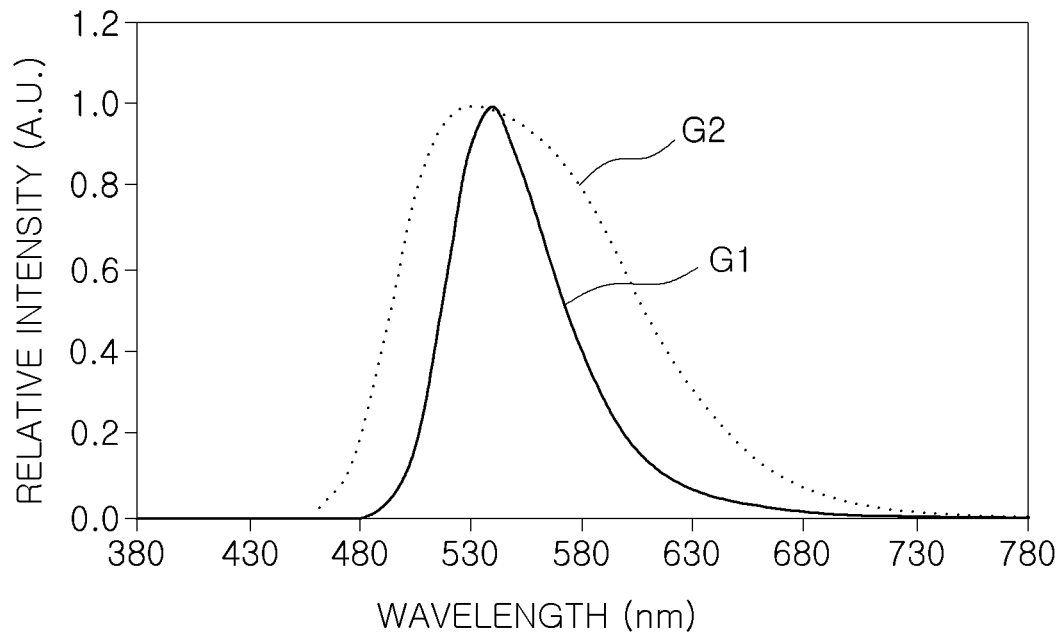
FIGS. 3 and 4 are graphs illustrating emission spectra of a first wavelength conversion material and a second wavelength conversion material in a white light emitting device according to an example embodiment, respectively.

The first wavelength conversion material 154 may be configured to emit green light having a peak wavelength slightly higher than that of a general green wavelength conversion material so as to lower the intensity in the band of about 465 nm to 495 nm in the spectrum of the final white light. FIG. 3 illustrates an emission spectrum G1 of $\beta\text{-Si}_{6-z}\text{Al}_z\text{O}_z\text{N}_{8-z}\text{:Eu}^{2+}$ ($0.01 \leq z \leq 5.99$) (hereinafter, also referred to as a "β-SiAlON" phosphor) as an example of the first wavelength conversion material 154 by excitation light having a peak wavelength of 448 nm.

Referring to FIG. 3, the β-SiAlON phosphor has a peak wavelength (for example, about 540 nm) relatively higher than that of another green phosphor (for example, a silicate phosphor). In addition, spectrum G1 by the β-SiAlON phosphor has a full width at half maximum (FWHM) (for example, about 56 nm) relatively smaller than an FWHM (for example, about 115 nm) of a spectrum G2 by another green phosphor (for example, the silicate phosphor).

Here, the first wavelength conversion material 154 having a peak wavelength in the range of 535 nm to 550 nm, and an FWHM of 60 nm or less may be used so as to sufficiently lower the intensity of the band of 465 nm to 495 nm in the spectrum of the white light.

In addition, spectrum G1 by the β-SiAlON phosphor has a relatively very low intensity (for example, 0.37%) at 480 nm. For example, the first wavelength conversion material 154 may have an emission spectrum having an intensity of 2% or less, and furthermore, a low intensity of 1% or less, of a peak intensity (for example, an intensity at about 532 nm), at 480 nm. As described above, the intensity at 480 nm is defined by a single spectrum G1 (see FIG. 3) of the light emitted from the first wavelength conversion material 154 rather than the spectrum of the final white light.

The first wavelength conversion material that may be a ceramic phosphor and/or a quantum dot satisfying the conditions of the peak wavelength and the FWHM (and/or a relative peak of 480 nm) described above, in addition to the β-SiAlON phosphor. For example, the quantum dot may include indium phosphide/zinc sulfide (InP/ZnS), indium phosphide/zinc selenide (InP/ZnSe), cadmium selenide/cadmium sulfide (CdSe/CdS), cadmium sulfide/zinc sulfide (CdSe/ZnS), phosphate-buffered saline/zinc sulfide (PbS/ZnS), indium phosphide/zinc selenide/zinc sulfide (InP/ZnSe/ZnS), indium phosphide/gallium phosphide/zinc sulfide (InP/GaP/ZnS), and/or combinations thereof.

The second wavelength conversion material 156 may be selectively dispersed in the transparent resin 152 so that the final white light having a sufficient color rendering index (for example, 80 or more) is provided, together with the first wavelength conversion material 154 according to a condition of the melanopic photopic ratio (M/P ratio).

Figure 4:
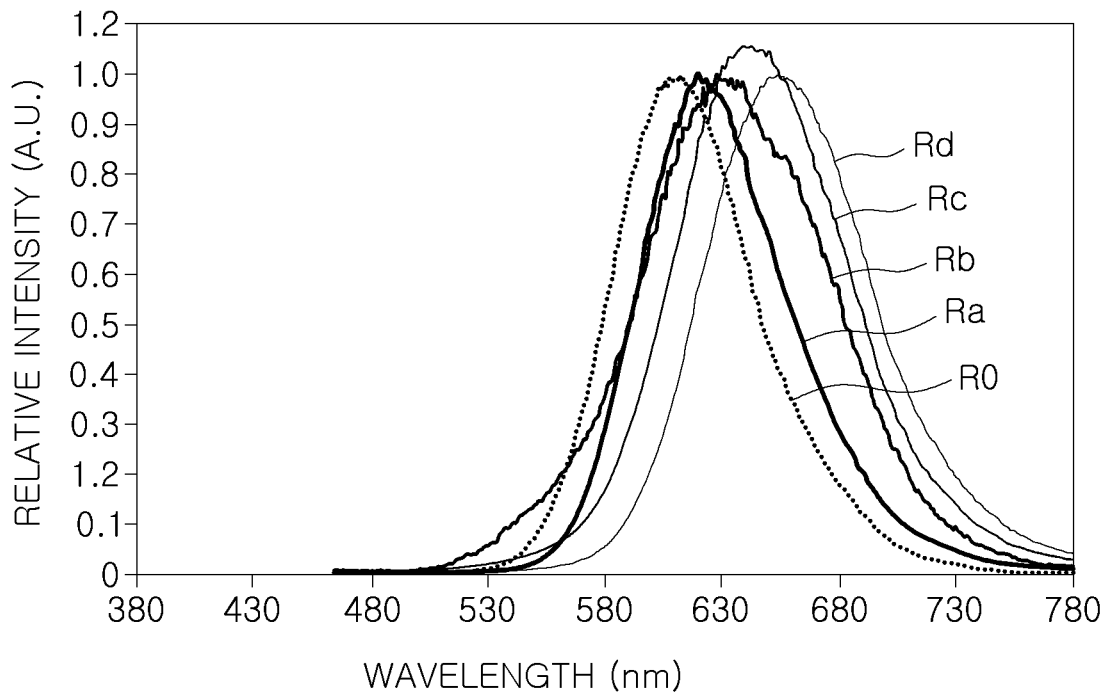

Referring to FIG. 4, emission spectra R0, Ra, Rb, Rc, and Rd of five samples (red phosphors) are illustrated.

As represented in Table 1 below, a spectrum R0 of a first sample has a peak wavelength of 612 nm and an FWHM of 68 nm, a spectrum Ra of a second sample has a peak wavelength of 620 nm and an FWHM of 71 nm, and a spectrum Rb of a third sample has a peak wavelength of 628 nm and an FWHM of 93 nm. In addition, a spectrum Rc of a fourth sample has a peak wavelength of 639 nm and an FWHM of 86 nm, and a spectrum Rd of a fifth sample has a peak wavelength of 655 nm and an FWHM of 83 nm.

TABLE 1

| Division | First Sample (R0) | Second Sample (Ra) | Third Sample (Rb) | Fourth Sample (Rc) | Fifth Sample (Rd) |
|---|---|---|---|---|---|
| Peak Wavelength | 612 nm | 620 nm | 628 nm | 639 nm | 655 nm |
| Full Width at Half Maximum (FWHM) | 68 nm | 71 nm | 93 nm | 86 nm | 83 nm |

White light emitting devices were manufactured by combining first to fifth samples R0, Ra, Rb, Rc, and Rd alone or a combination thereof as represented in Table 2. Here, a red phosphor and the β-SiAlON phosphor are described with reference to FIG. 3 as a green phosphor with a blue LED having a peak wavelength of 448 nm as an excitation light source, and color rendering indexes of white light emitted from each of the white light emitting devices were measured.

TABLE 2

| Red Phosphor | First Sample (R0) Alone | Second Sample (Ra) Alone | Third Sample (Rb) Alone | Combination of Second Sample (Ra) and Fourth Sample (Rc) | Combination of Second Sample (Ra) and Fifth Sample (Rd) |
|---|---|---|---|---|---|
| Color Rendering Index | 76 | 82 | 86 | 86 | 87 |

As illustrated in Table 2, it is difficult to obtain a sufficient color rendering index (for example, 80 or more) with the red phosphor alone of the first sample R0, and when the red phosphor according to the second sample Ra and the third sample Rb and a combination thereof is used, a white light emitting device might be configured to emit white light having a high color rendering index of 80 or more (for example, 86 or 87).

As described above, in consideration of the color rendering index, the second wavelength conversion material 156 may emit light having a peak wavelength in the range of about 620 nm to 660 nm. In some example embodiments, the second wavelength conversion material 156 may have an FWHM of 70 nm or more. In a specific example embodiment, a combination of two or more red phosphors having different wavelengths may be used as the second wavelength conversion material 156.

A red phosphor or a quantum dot satisfying such a wavelength condition may be used as the second wavelength conversion material 156. For example, the second wavelength conversion material 156 may include $(Sr,Ca)AlSiN_3$:Eu, $CaAlSiN_3$:Eu, $K_xSiF_y$:$Mn^{4+}$ ($2 \leq x \leq 3$ and $4 \leq y \leq 7$) (hereinafter also referred to as a "KSF phosphor"), and combinations thereof.

In addition, a desired correlated color temperature may be implemented by adjusting a mixing ratio of the first wavelength conversion material 154 and the second wavelength conversion material 156. For example, as an amount of the second wavelength conversion material 156 increases, the correlated color temperature may decrease (e.g., warm white), and as an amount of the second wavelength conversion material 156 decreases, the correlated color temperature may increase (e.g., cool white).

As described above, according to the one or more embodiments, a white light emitting device for human-centric lighting that satisfies the color rendering index simultaneously adjusting the secretion of melatonin hormone involved in human biorhythms by lowering the intensity in the melanopic sensitivity band (for example, 465 nm to 495 nm) may be provided.

Figure 5:
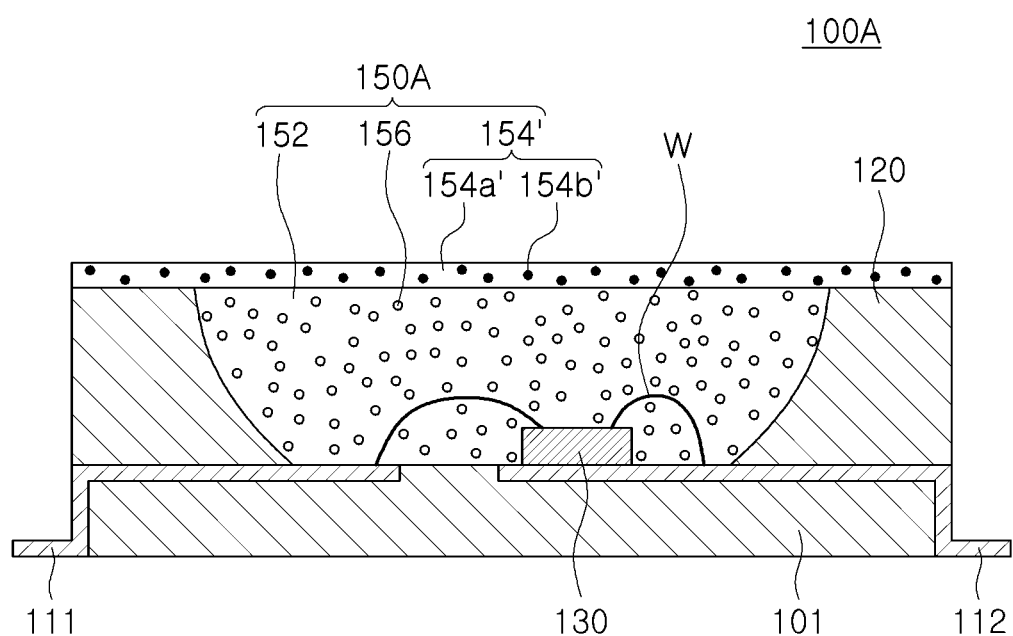
FIG. 5 is a schematic cross-sectional view illustrating a white light emitting device according to an example embodiment.

FIG. 5 is a schematic cross-sectional view illustrating a white light emitting device according to an example embodiment.

Referring to FIG. 5, it may be understood that a white light emitting device 100A according to an example embodiment is similar to the white light emitting device 100 illustrated in FIG. 1 except that at least some of wavelength conversion materials are provided in film form. In addition, components according to the one or more embodiments may be understood with reference to the description of the same or similar components of the white light emitting device 100 illustrated in FIG. 1 unless explicitly described otherwise.

A wavelength conversion portion 150A according to an embodiment may be implemented by a combination of an encapsulation form and a film form. As illustrated in FIG. 5, the encapsulation form may have a structure in which second wavelength conversion materials 156 are mixed with a transparent resin 152, similar to the wavelength conversion portion 150A in FIG. 1. In addition, the film form may include a wavelength conversion film 154' containing first wavelength conversion materials 154b' and formed to be stacked on a emission surface. For example, the wavelength conversion film 154' may be a structure in which a transparent resin 154a' is mixed with a binder or be a ceramic film formed of a phosphor itself. In addition, the white light emitting device according to an example embodiment may have various structures. In some example embodiments, such a wavelength conversion film may be applied directly to a surface of an LED chip (see FIG. 16).

Figure 6A:
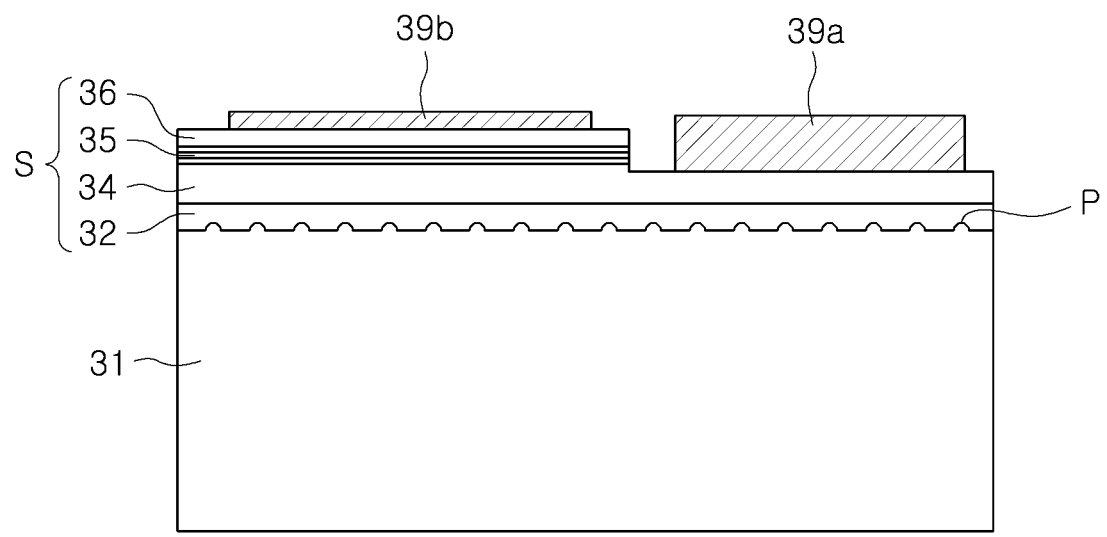
FIGS. 6A and 6B are schematic cross-sectional views illustrating light emitting diode chips in a white light emitting device according to example embodiments.
Figure 6B:
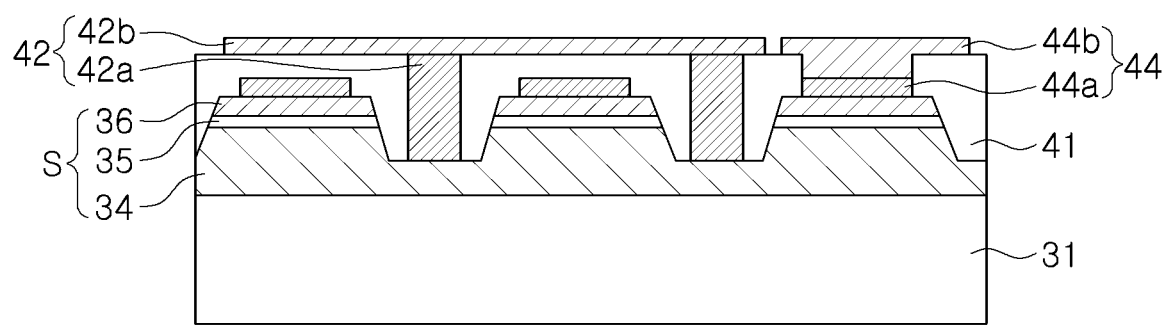

FIGS. 6A and 6B are schematic cross-sectional views illustrating light emitting diode chips in a white light emitting device according to example embodiments.

Referring to FIG. 6A, an LED chip 30A may include a substrate 31 and a semiconductor laminate S disposed on the substrate 31. The semiconductor laminate S may include a first conductivity-type semiconductor layer 34, an active layer 35, and a second conductivity-type semiconductor layer 36 sequentially disposed on the substrate 31. A buffer layer 32 may be additionally disposed between the substrate 31 and the first conductivity-type semiconductor layer 34.

The substrate 31 may be an insulating substrate formed of a material such as sapphire. However, the substrate 31 is not limited to the insulating substrate, and may also be a conductive substrate or a semiconductor substrate. For example, the substrate 31 may be formed of SiC, Si, $MgAl_2O_4$, MgO, $LiAlO_2$, $LiGaO_2$, or GaN, in addition to the sapphire. An unevenness P may be formed on an upper surface of the substrate 31. The unevenness P may improve a quality of a single crystal grown while improving light extraction efficiency.

The buffer layer 32 may include undoped $In_xAl_yGa_{1-x-y}N$ (where, $0 \leq x \leq 1$ and $0 \leq y \leq 1$). For example, the buffer layer 32 may be formed of GaN, AlN, AlGaN, or InGaN. In the buffer layer 32, a plurality of layers may be combined with each other or a composition may be gradually changed and used, if necessary.

The first conductivity-type semiconductor layer 34 may be a nitride semiconductor layer satisfying n-type $In_xAl_yGa_{1-x-y}N$ (where, $0 \leq x < 1$, $0 \leq y \leq 1$, and $0 \leq x+y < 1$), and n-type impurities may be Si. For example, the first conductivity-type semiconductor layer 34 may include n-type GaN. The second conductivity-type semiconductor layer 36 may be a nitride semiconductor layer satisfying p-type $In_xAl_yGa_{1-x-y}N$ (where, $0 \leq x < 1$, $0 \leq y < 1$, and $0 \leq x+y < 1$), and p-type impurities may be Mg. For example, the second conductivity-type semiconductor layer 36 may be implemented in a single layer structure, but may have a multilayer structure having different compositions, as in the present example.

The active layer 35 may have a multiple quantum well (MQW) structure in which quantum well layers and quantum barrier layers are alternately stacked. For example, the quantum well layer and the quantum barrier layer may be formed of $In_xAl_yGa_{1-x-y}N$ (where, $0 \leq x \leq 1$, $0 \leq y \leq 1$, and $0 \leq x+y \leq 1$) having different compositions. In a specific example, the quantum well layer may be formed of $In_xGa_{1-x}N$ (where, $0 < x \leq 1$), and the quantum barrier layer may be formed of GaN or AlGaN. Each of the quantum well layer and the quantum barrier layer may have a thickness in the range of about 1 nm to 50 nm. The active layer 35 is not limited to having the multiple quantum well structure, and may have a single quantum well structure.

A first electrode 39a and a second electrode 39b may be disposed in a mesa-etched region of the first conductivity-type semiconductor layer 34 and the second conductivity-type semiconductor layer 36, respectively, so as to be positioned on the same surface (e.g., a first surface or a top surface). The first electrode 39a may include a material such as Ag, Ni, Al, Cr, Rh, Pd, Ir, Ru, Mg, Zn, Pt, or Au, and may have a single layer structure or a structure having two or more layers, but is not limited thereto. In some example embodiments, the second electrode 39b may be a transparent electrode formed of a transparent conductive oxide or a transparent conductive nitride, or may include graphene. The second electrode 39b may include at least from among Al, Au, Cr, Ni, Ti, and Sn.

Referring to FIG. 6B, it may be understood that an LED chip 30B according to the one or more embodiments is similar to the LED chip 30A illustrated in FIG. 5 except for an electrode structure and related structures thereof. Components according to the present example embodiment may be understood with reference to the description of the same or similar components of the LED chip 30A illustrated in FIG. 6A unless explicitly described otherwise.

The LED chip 30B includes a first electrode 42 and a second electrode 44 that are connected, respectively, to the first conductivity-type semiconductor layer 34 and a second conductivity-type semiconductor layer 36. The first electrode 42 may include a connection electrode portion 42a connected to the first conductivity-type semiconductor layer 34 penetrating through the second conductivity-type semiconductor layer 36 and the active layer 35 and a first electrode pad 42b connected to a top surface of the connection electrode portion 42a. The connection electrode portion 42a may have a structure such as a conductive via. The connection electrode portion 42a may be surrounded by an insulating portion 41 to be electrically separated from the active layer 35 and the second conductivity-type semiconductor layer 36. The connection electrode portion 42a may be disposed in a region where the semiconductor laminate S is etched. The number, a shape, or a pitch of connection electrode portions 42a, a contact area of the connection electrode portions 42a with the first conductivity-type semiconductor layer 34, or the like, may be appropriately designed so that contact resistance is decreased. In addition, the connection electrode portions 42a may be arranged to form rows and columns on the semiconductor laminate S, resulting in improvement in a current flow. The second electrode 44 may include an ohmic contact layer 44a on the second conductivity-type semiconductor layer 36 and a second electrode pad 44b.

The connection electrode portion 42a and the ohmic contact layer 44a may include a conductive material having ohmic characteristics with respect to the first conductivity-type semiconductor layer 34 and the second conductivity-type semiconductor layer 36 and having a single-layer structure or multilayer structure. For example, the connection electrode portion 42a and the ohmic contact layer 44a may be formed by a process of depositing or sputtering one or more of a metal such as Ag, Al, Ni, and Cr, and a transparent conductive oxide (TCO), such as an indium tin oxide (ITO).

The first electrode pad 42b and the second electrode pad 44b may be connected to the connection electrode portion 42a and the ohmic contact layer 44a, respectively, to function as external terminals of the LED chip 30B. For example, the first electrode pad 42b and the second electrode pad 44b may be formed of Au, Ag, Al, Ti, W, Cu, Sn, Ni, Pt, Cr, NiSn, TiW, AuSn, or eutectic metals thereof.

The first electrode 42 and the second electrode 44 may be disposed in the same direction, and may be mounted on or included in a so-called flip chip form on a lead frame or the like. The two electrodes 42 and 44 may be electrically separated from each other by the insulating portion 41. The insulating portion 41 may be formed of any material having an electrical insulating property, but may be formed of a material having a low light absorptivity. For example, a silicon oxide or a silicon nitride may be used as a material of the insulating portion 41. The insulating portion 41 may have a light reflective structure formed by dispersing light reflective powder particles in a light transmissive material, if necessary. Alternatively, the insulating portion 121 may have a multilayer reflective structure in which a plurality of insulating films having different refractive indexes are alternately stacked. For example, such a multilayer reflective structure may be a distributed Bragg reflector (DBR) in which first insulating films having a first refractive index and second insulating films having a second refractive index are alternately stacked.

In the multilayer reflective structure, a plurality of insulating films having different refractive indexes may be repeatedly stacked from about 2 to 100 times. For example, the plurality of insulating films may be repeatedly stacked from about 3 to 70 times, and furthermore, be repeatedly stacked from about 4 to 50 times. Each of the plurality of insulating films of the multilayer reflective structure may be formed of an oxide or a nitride such as $SiO_2$, $SiN$, $SiO_xN_y$, $TiO_2$, $Si_3N_4$, $Al_2O_3$, $TiN$, $AlN$, $ZrO_2$, $TiAlN$, or $TiSiN$, and combinations thereof. The refractive indexes of the first and second insulating films may be determined in the range of about 1.4 to about 2.5, and may be smaller than a refractive index of the first conductivity-type semiconductor layer 34 and a refractive index of the substrate 31, or may be smaller than a refractive index of the first conductivity-type semiconductor layer 34 and greater than a refractive index of the substrate 31. The LED chips 30A and 30B having the form described above may be used as the blue light emitting diode 130 of the white light emitting devices 100 and 100A.

In order to confirm a relationship between a melanopic photopic ratio (M/P ratio) and a correlated color temperature of the white light emitting device according to the one or more embodiments, a plurality of white light emitting devices were manufactured for each correlated color temperature.

Specifically, a plurality of white light emitting devices in which an M/P ratio is decreased were prepared for each correlated color temperature by combining a first wavelength conversion material (β-SiAlON) and a second wavelength conversion material ((Sr,Ca)AlSiN$_3$:Eu) with each other together with a blue LED emitting blue light of a wavelength of 448 nm. Here, correlated color temperatures of white light were designed to be different from each other by adjusting a mixing ratio of the first and second wavelength conversion materials. The white light emitted from the white light emitting devices manufactured in this manner may have a color rendering index of 80 or more (85 or more in some example embodiments).

Figure 7:
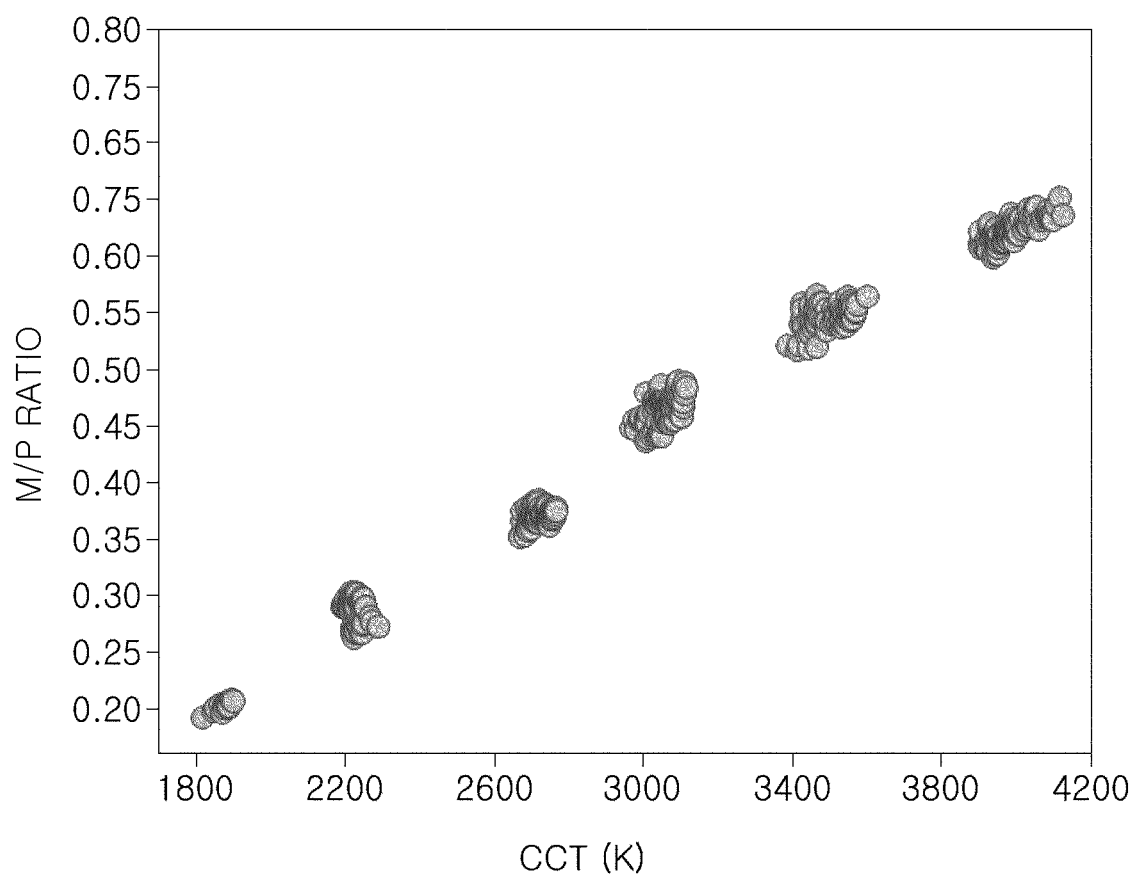
FIG. 7 is a graph illustrating a melanopic photopic ratio according to a correlated color temperature of a white light emitting device according to various example embodiments.

An M/P ratio distribution of the white light of the white light emitting devices according to each correlated color temperature is represented in a graph of FIG. 7.

Referring to FIG. 7, the white light emitting devices may have a relatively low M/P ratio of 0.65 or less. For example, a melanopic photopic ratio of the white light of the white light emitting device according to the present example embodiment may be in the range of about 0.1 to 0.65 in the range of a correlated color temperature of about 1800 K to 4200 K.

The M/P ratio of white light tends to decrease as the correlated color temperature decreases. Specifically, the white light emitting devices at 1800 K have an M/P ratio in the range of about 0.15 to 0.23, and the white light emitting devices at 2200 K have an M/P ratio in the range of about 0.15 to 0.23. In addition, the white light emitting devices at 2700 K and 3000 K have M/P ratios in the range of about 0.34 to 0.40 and the range of about 0.43 to 0.50, respectively, and the white light emitting devices at 3500 K and 4000 K have M/P in the range of about 0.50 to 0.58 and the range of about 0.58 to 0.65, respectively.

If the M/P ratio distribution is divided into correlated color temperature sections, when the correlated color temperature of the white light is in the range of about 1800 K to 2500 K, the M/P ratio of the white light may be in the range of about 0.15 to 0.35. When the correlated color temperature of the white light is in the range of about 2500 K to 3200 K, the M/P ratio of the white light may be in the range of about 0.3 to 0.5. In addition, when the correlated color temperature of the white light is in the range of about 3200 K to 4200 K, the M/P ratio of the white light may be in the range of about 0.45 to 0.65.

The white light emitting device according to the one or more embodiments may be defined using conditions (see spectral conditions 1 and 2 to be described later) based on a profile of the spectrum of the white light. These two spectral conditions are described with reference to FIG. 8.

Figure 8:
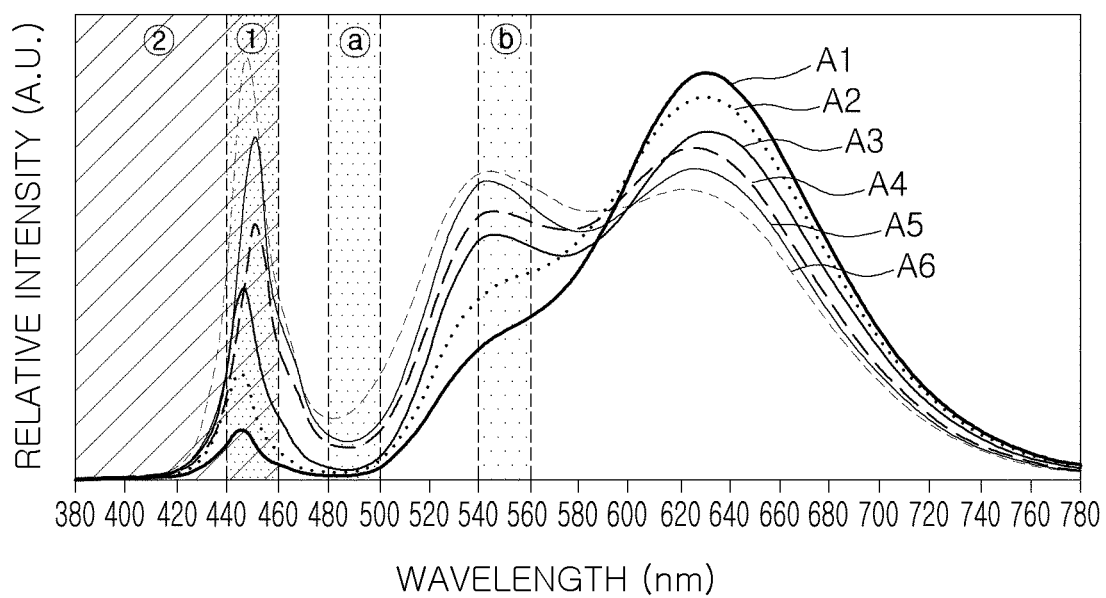
FIG. 8 is a graph illustrating emission spectra of white light of a white light emitting device according to various example embodiments.

FIG. 8 is a graph illustrating emission spectra of white light of a white light emitting device according to various example embodiments.

Referring to FIG. 8, one sample for each correlated color temperature among the above-mentioned example embodiments is selected, and a spectrum of white light for each sample is illustrated. Table 3 below represents an M/P ratio of each sample.

TABLE 3

| Item | A1 | A2 | A3 | A4 | A5 | A6 |
|---|---|---|---|---|---|---|
| Correlated Color Temperature (K) | 1800 | 2200 | 2700 | 3000 | 3500 | 4000 |
| M/P Ratio | 0.20 | 0.28 | 0.37 | 0.48 | 0.56 | 0.64 |

First, a first spectral condition may be defined as a ratio of light emitted from a blue LED (that is, light ① emitted from the blue LED that is not converted) to light ② within an entire blue wavelength band in a spectrum of final white light. Here, an integral value of ① may be expressed as an integral amount of a spectrum corresponding to a band of about 440 nm to 460 nm, and an integral value of ② may be expressed as an integral amount of a spectrum corresponding to a band of about 380 nm to 500 nm. The integral value of ① may have a ratio of a predetermined magnitude in proportion to the integral value of ②, while the integral value of ② may have a relatively small value because a light amount is decreased in a band related to melatonin as compared with white light according to a conventional manner.

As represented in Table 4 below, a ratio (①/②) according to the first spectral condition may be in the range of about 50% to 65%. In other words, in the spectrum of the white light according to the present example embodiment, the integral value ① in the band of about 440 nm to 460 nm may be in the range of about 50% to 65% of the integral value ② in the band of about 380 nm to 500 nm.

TABLE 4

| Item | A1 | A2 | A3 | A4 | A5 | A6 |
|---|---|---|---|---|---|---|
| Correlated Color Temperature (K) | 1800 | 2200 | 2700 | 3000 | 3500 | 4000 |
| First Spectral Condition (①/②) | 55% | 58% | 63% | 57% | 58% | 56% |
| Second Spectral Condition (ⓐ/ⓑ) | 4.1% | 5.1% | 5.3% | 14% | 16% | 25% |

The second spectral condition may be defined as a ratio of light (ⓐ) in a cyan band to light (ⓑ) in a green band in the spectrum of the final white light. Here, an integral value of ⓐ may be expressed as an integral amount of a spectrum corresponding to a band of about 480 nm to 500 nm, and an integral value of ⓑ may be expressed as an integral amount of a spectrum corresponding to a band of about 540 nm to 550 nm. The integral value of ⓐ, which is a light amount related to the M/P ratio, may have a relatively small value as the melanopic photopic ratio becomes small.

As represented in Table 4, a ratio (ⓐ/ⓑ) according to the second spectral condition may be 30% or less, and preferably, 26% or less. In other words, in the spectrum of the white light according to the present example embodiment, the integral value in the band of about 480 nm to 500 nm may be in the range of 26% or less of the integral value in the band of about 540 nm to 560 nm.

Figure 9A:
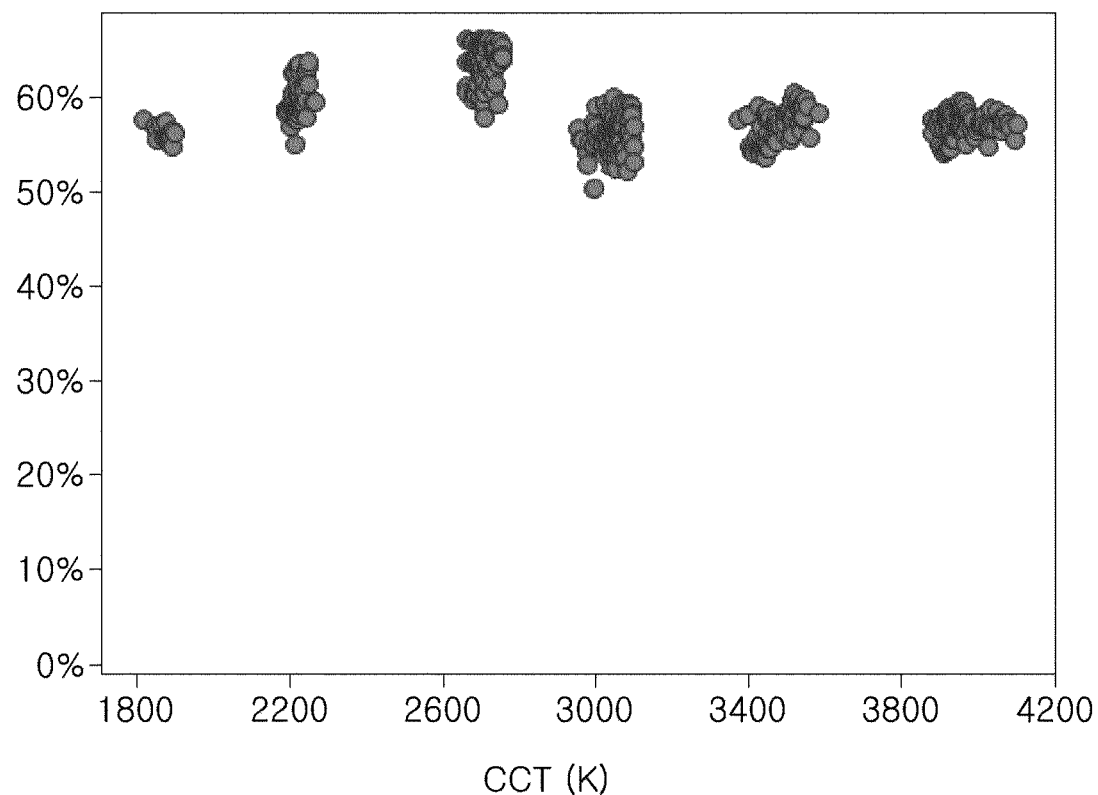
FIGS. 9A and 9B are graphs illustrating a first spectral condition and a second spectral condition of white light of a white light emitting device according to various example embodiments.
Figure 9B:
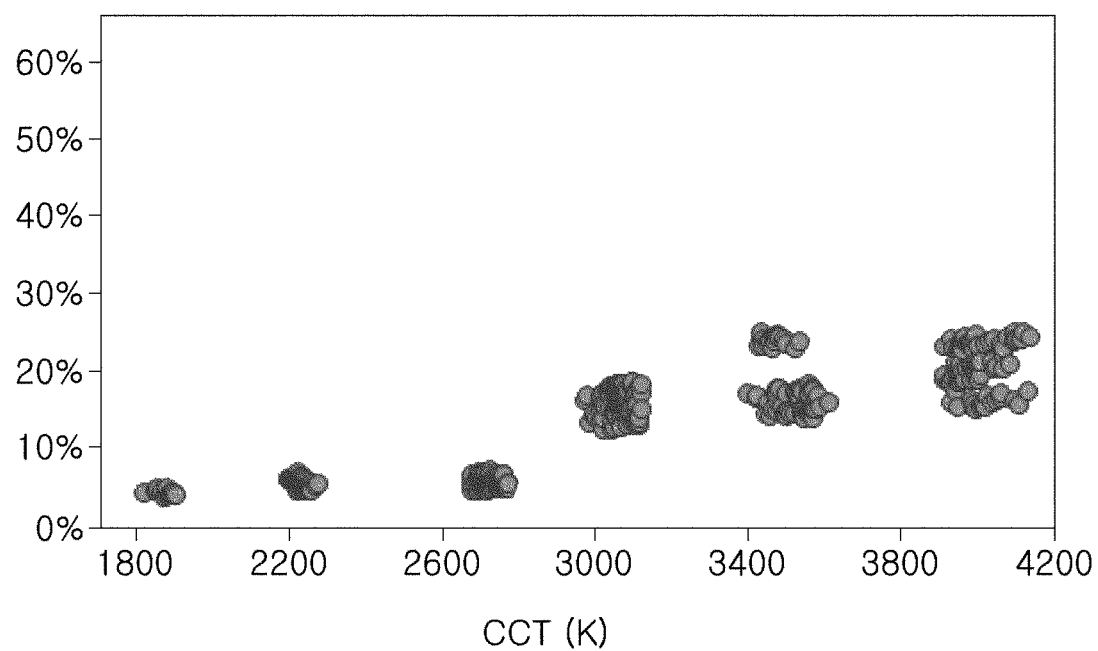

FIGS. 9A and 9B illustrate a first spectral condition and a second spectral condition for each correlated color temperature for all samples used in FIG. 7.

The white light emitted from the white light emitting device according to the one or more embodiments may have a spectrum in which the integral value in the band of about 440 nm to 460 nm is in the range of about 50% to 65% of the integral value in the band of about 380 nm to 500 nm and the integral value in the band of about 480 nm to 500 nm is in the range of 26% or less of the integral value in the band of about 540 nm to 560 nm.

Here, the second spectral condition, which is a value related to the melanopic photopic ratio (M/P ratio), may be additionally classified according to the correlated color temperature. For example, referring to FIG. 9B, when the correlated color temperature of the white light is in the range of about 1800 K to 2800 K, the integral value in the band of about 480 nm to 500 nm may be in the range of 10% or less of the integral value in the band of about 540 nm to 560 nm. When the correlated color temperature of the white light is in the range of about 2800 K to 4200 K, the integral value in the band of about 480 nm to 500 nm may be in the range of about 10% to 26% of the integral value in the band of about 540 nm to 560 nm.

The white light emitting device according to the one or more embodiments may be implemented in an LED lighting apparatus capable of adjusting the secretion of melatonin hormone involved in a human biological rhythm. Such an LED lighting apparatus may be beneficially used as a human-friendly night lighting apparatus.

In some example embodiments, an LED lighting apparatus capable of selectively providing desired lighting illumination in a specific environment by implementing the white light emitting device according to the above-mentioned example embodiments as a first LED light source unit and implementing a white light emitting device configured to improve concentration by increasing an intensity in a blue band (for example, a band of 465 nm to 495 nm) to suppress melatonin as a second LED light source unit may be provided.

Figure 10:
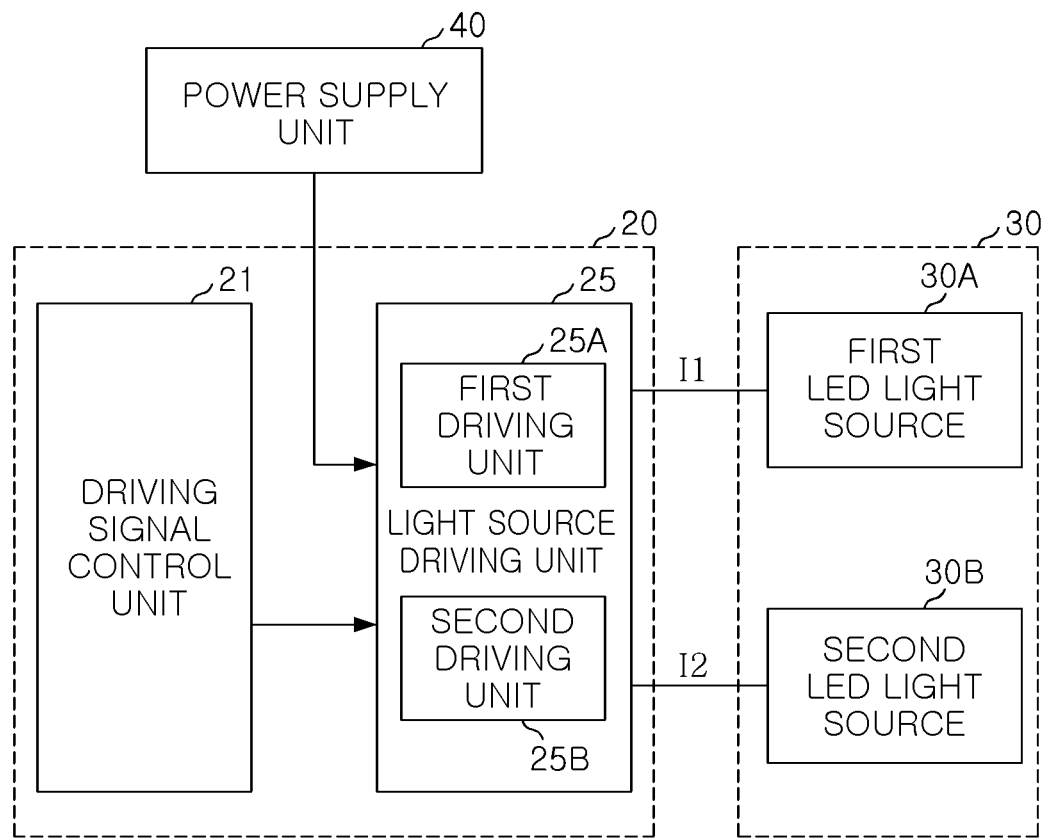
FIG. 10 is a block diagram of a light emitting diode (LED) lighting apparatus according to an example embodiment.

FIG. 10 is a block diagram of an LED lighting apparatus according to an example embodiment.

Referring to FIG. 10, the LED lighting apparatus according to the one or more embodiments may include a driving control unit 20, a light source unit 30, and a power supply unit 40. The light source unit 30 and the driving control unit 20 may be configured as one module or separate modules.

The power supply unit 40 may supply alternating current (AC) or direct current (DC) power to a light source driving unit 25 of the driving control unit 20. The driving control unit 20 may include the light source driving unit 25 and a driving signal control unit 21 providing a driving signal for controlling the light source driving unit 25. The light source driving unit 25 may be connected to the power supply unit 40 to receive the power supplied from the power supply unit 40 and supply currents I1 and I2 controlled by the driving signal of the driving signal control unit 21, respectively, to a first LED light source 30A and a second LED light source 30B included in the light source unit 30. According to the one or more embodiments, the light source driving unit 25 may be controlled so that the same currents I1 and I2 are applied to the first LED light source 30A and the second LED light source 30B, respectively.

In some example embodiments, the driving control unit 20 may further include a communications module configured to transmit and receive data of color characteristics such as a correlated color temperature measured inside or outside the LED lighting apparatus. The driving control unit 20 may further include a signal processing unit configured to process sensor data of at least one from among an illuminance sensor, a motion sensor, and an image sensor, and transmit and receive the sensor signal to or from the white light emitting device 100.

According to an embodiment, the first LED light source 30A includes first white light emitting devices configured to secrete melatonin well by decreasing an intensity in a blue band (for example, a band of 465 nm to 495 nm), similar to the white light emitting devices 100 and 100A according to the one or more embodiments described above, and the second LED light source 30B may include a second white light emitting device configured to improve concentration by increasing the intensity in the blue band (for example, the band of 465 nm to 495 nm) to suppress the melatonin. A second white light emitting device 200 for such a second LED light source 30B is illustrated in FIG. 11.

Figure 11:
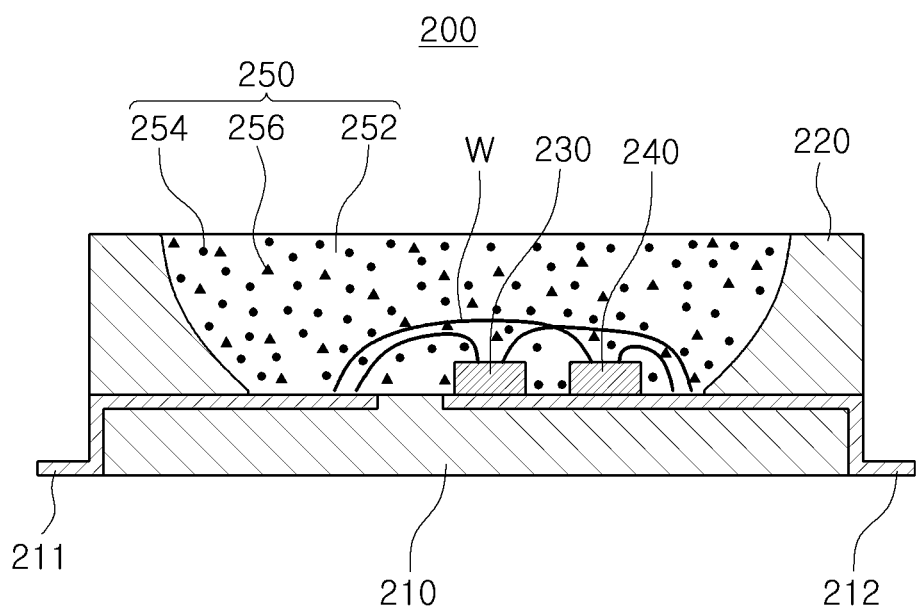
FIG. 11 is a cross-sectional view illustrating a white light emitting device as a second light source of the LED lighting apparatus of FIG. 10.

Referring to FIG. 11, the white light emitting device 200 according to an embodiment may include a package substrate 210 having a cavity and having a first lead frame 211 and a second lead frame 212, first light emitting diodes (LEDs) 230 and second light emitting diodes (LEDs) 240 disposed in the cavity of the package substrate 210, and a sidewall reflection portion 220 disposed on the package substrate 210 and the lead frames 211 and 212. The sidewall reflection portion 220 may be formed as a cavity accommodating the first LEDs 230 and the second LEDs 240 provided therein. Furthermore, the white light emitting device 200 may include a wavelength conversion portion 250 disposed in the cavity so as to cover the first LEDs 230 and the second LEDs 240.

The first LEDs 230 and the second LEDs 240 may be connected, respectively, to the first lead frame 211 and the second lead frame 212 in the cavity. In an example embodiment, the connection may be made by wires W, but is not limited thereto, and may be made in a flip-chip manner. The first LED 230 may be configured to emit first blue light having a peak wavelength in the range of about 430 nm to 455 nm, and the second LED 240 may be configured to emit second blue light having a peak wavelength in the range of about 465 nm to 495 nm. The wavelength conversion portion 250 may include a light transmissive resin 252 including wavelength conversion materials. The wavelength conversion materials may include first wavelength conversion materials 254 emitting first light having a peak wavelength in the range of about 520 nm to 560 nm and a second wavelength conversion material 256 emitting second light having a peak wavelength in the range of about 590 nm to 655 nm. For example, the first wavelength conversion material 254 may include at least one phosphor selected from among Ga—$Y_3Al_5O_{12}$ (hereinafter also referred to as YAG), $Al_5Lu_3O_{12}$, $Y_3Al_5O_{12}.Al_5Lu_3O_{12}$, and combinations thereof. The second wavelength conversion material 256 may include (Sr,Ca)AlSiN$_3$:Eu, CaAlSiN$_3$:Eu, $K_xSiF_y$:Mn$^{4+}$ (where, $2 \leq x \leq 3$ and $4 \leq y \leq 7$), and combinations thereof. At least one from among the first wavelength conversion material 254 and the second wavelength conversion material 256 may include two or more types of phosphors. At least one from among the first wavelength conversion material 254 and the second wavelength conversion material 256 may have an excitation efficiency of the first blue light higher than that of the second blue light.

As described above, the second white light emitting device 200 may decrease a blue light hazard (BLH) by applying relatively soft second blue light together with the first blue light. In addition, it is possible to increase a color rendering index through a combination of the first wavelength conversion material 254 and the second wavelength conversion material 256 as well as decrease the BLH by adjusting an intensity ratio between the first blue light and the second blue light.

Figure 12:
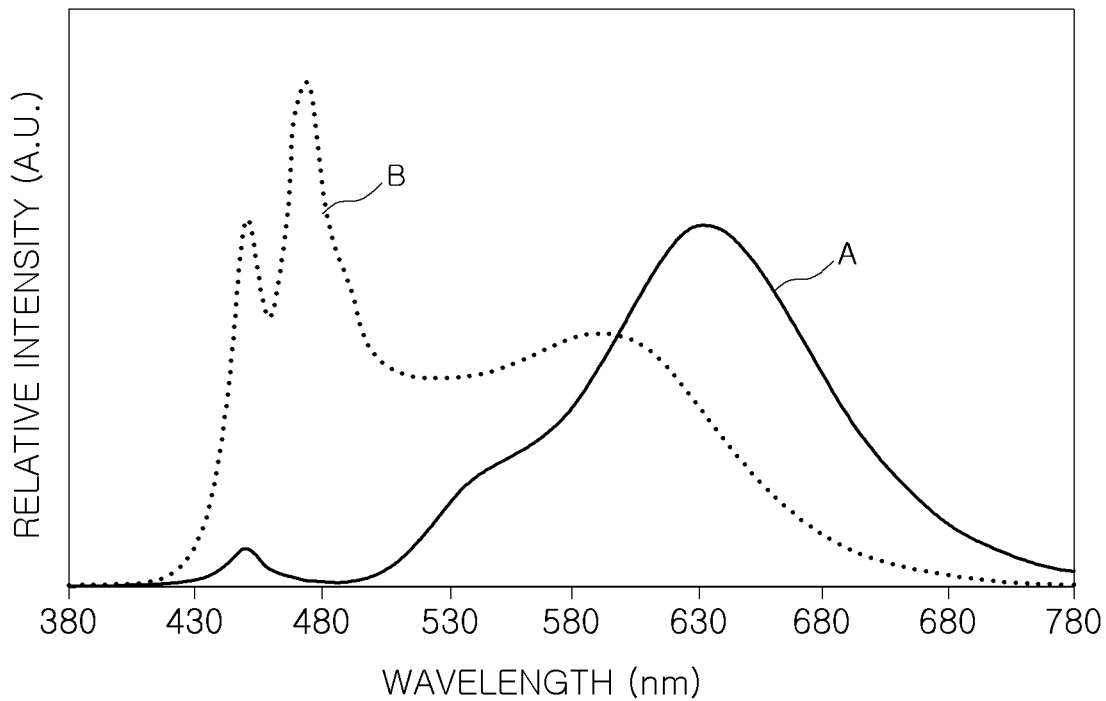
FIG. 12 is a graph illustrating emission spectra of first white light emitted from a first white light emitting device and second white light emitted from a second white light emitting device of an LED lighting apparatus according to an example embodiment.

Referring to FIG. 12, in a spectrum B of white light of the second white light emitting device 200, a peak intensity of the second blue light may be 50% or more of the first blue light. A peak intensity ratio between the first blue light and the second blue light may be selected to be 70% or more for the purpose of a BLH decrease effect, and furthermore, a peak intensity of the second blue light may be selected to be greater than that of the first blue light. A wavelength and an intensity ratio of the second blue light may be adjusted in a range in which the color rendering index (CRI) is maintained at 80 or more, and preferably, 85 or more. In addition, in terms of color rendering, a maximum intensity of the second blue light in a band of about 520 nm to 560 nm may be in the range of about 40% to 160% of the peak intensity of the second blue light.

As described above, the first light (for example, cyan, green, or yellow) having the peak wavelength in the range of about 520 nm to 560 nm may be combined with the second light of a peak wavelength in the range of about 590 nm to 655 nm together with the first blue light having the peak wavelength in the range of about 430 nm to 455 nm and the second blue light having the peak wavelength in the range of about 465 nm to 495 nm to provide white light (particularly, in the daytime) for human-friendly lighting. A color rendering index (CRI) of such white light may be maintained at 80 or more, and preferably, 85 or more.

Referring to FIG. 12, spectrum A of the white light of the first white light emitting devices 100 and 100A according to the above-mentioned example embodiments is illustrated together with spectrum B of the white light of the second white light emitting device 200. In the white light spectrum A of the first white light emitting device, an intensity in a blue band may be decreased to provide human-friendly white light (particularly in the nighttime) so that melatonin hormone may be secreted well.

In some example embodiments, a melanopic photopic (M/P) ratio of the first white light A may be 0.65 or less, and a melanopic photopic (M/P) ratio of the second white light B may be 0.5 or more.

In the one or more embodiments, the light source driving unit 25 may independently control the currents I1 and I2 supplied to the first LED light source 30A and the second LED light source 30B according to the driving signal of the driving signal control unit 21. For example, the light source driving unit 25 may drive the first LED light source 30A in the nighttime to provide lighting illumination suitable for the nighttime, and may drive the second LED light source 30B in the daytime to provide lighting illumination suitable for the daytime. In some example embodiments, the light source unit 30 may be controlled by the driving control unit 20 to emit white light having intermediate characteristic by mixing white light generated by the first LED light source 30A with white light generated by the second light source 30B. In this case, a luminous flux of the mixed white light may be maintained within a predetermined range.

First white light of the first LED light source 30A may be generally implemented in a correlated color temperature range lower than that of second white light of the second LED light source 30B, but is not limited thereto.

Figure 13:
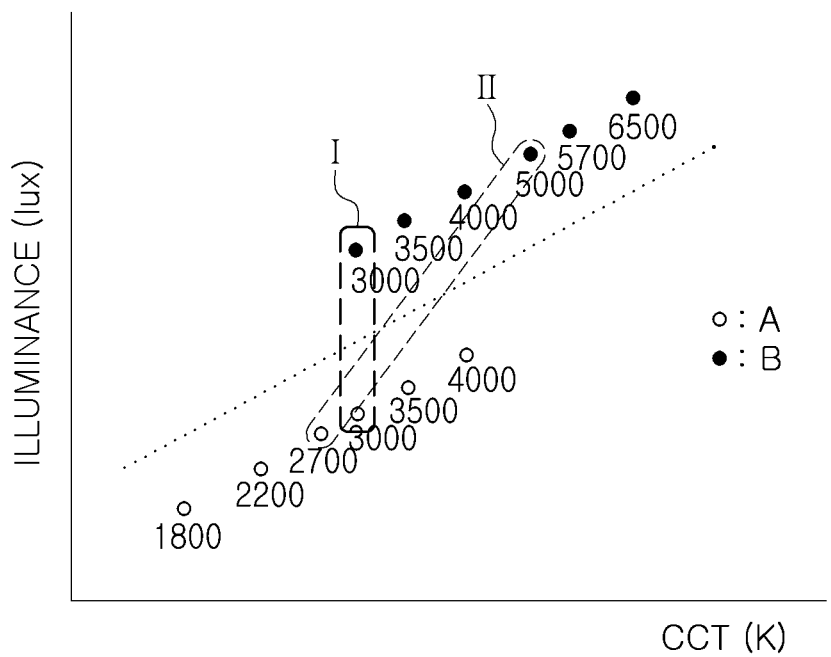
FIG. 13 is a graph illustrating selective control of first white light and second white light of an LED lighting apparatus according to an example embodiment.

For example, as illustrated in FIG. 13, the first white light A of the first LED light source 30A may have a correlated color temperature in the range of about 1800K to 4000 K, and the second white light B of the second LED light source 30B may have a correlated color temperature of 3000 K or higher.

Selective control of the first white light and the second white light may be determined in consideration of a correlated color temperature range that may be implemented. For example, as indicated by "II", the light source unit 30 of the LED lighting apparatus may be configured so that the first white light A has a first correlated color temperature (for example, 2700 K) and the second white light B has a second correlated color temperature (for example, 5000 K) higher than the first correlated color temperature. In this case, the light source unit 30 may be driven so that one of the first white light A and the second white light B having different correlated color temperatures is emitted according to a desired environment.

In contrast, in some example embodiment, as indicated by "I", the first white light A and the second white light B have the same or similar correlated color temperature, and the light source unit 30 may be driven so that one of the first white light A and the second white light B having the same or similar correlated color temperature is emitted according to a desired environment. In this case, the first white light A and the second white light B may have a correlated color temperature in the range of 3000 K to 4000 K.

Figure 14:
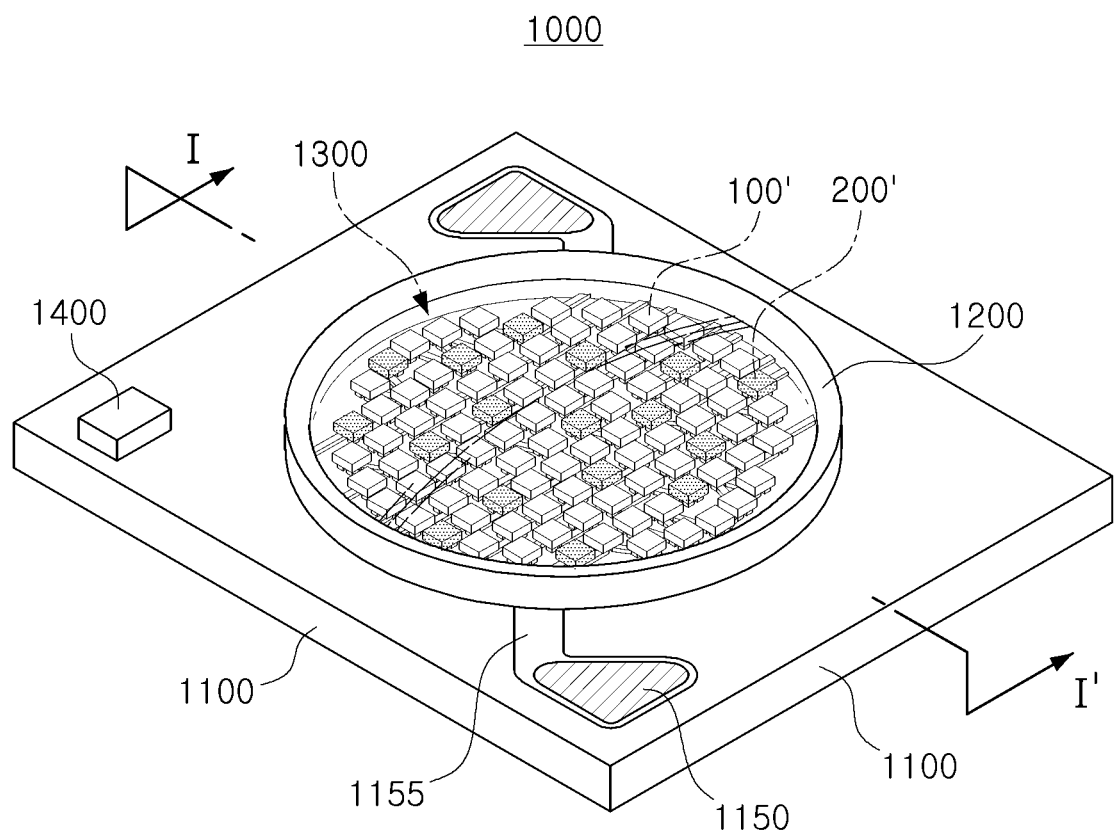
FIGS. 14 and 15 are a perspective view and a side cross-sectional view of an LED light emitting module according to an example embodiment.
Figure 15:
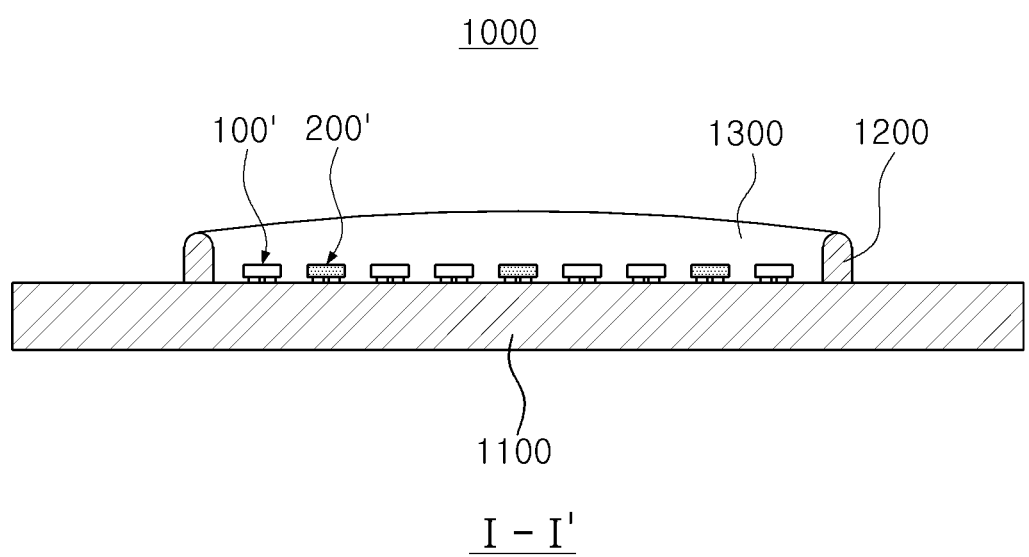

FIG. 14 is a schematic perspective view illustrating a light emitting module for an LED lighting apparatus according to an example embodiment, and FIG. 15 is a cross-sectional view taken along line I-I' of the light emitting module of FIG. 14.

Referring to FIGS. 14 and 15, a light emitting module 1000 according to an example embodiment may include a circuit board 1100, first LED light source 100' and second LED light source 200' mounted on the circuit board 1100, a dam 1200 surrounding the first LED light source 100' and the second LED light source 200', an encapsulation portion 1300 covering the first LED light source 100' and the second LED light source 200', and a driving control chip 1400. Each of the first LED light source 100' and the second LED light source 200' may include a plurality of first white light emitting devices and a plurality of second white light emitting devices, respectively, as described in the one or more example embodiments. In addition, the driving control unit 20 described in FIG. 10 may be implemented as a driving control chip 1400.

The circuit board 1100 may include a conductive material and an insulating material, and a metal pattern 1155 connected to the first LED light source 100' and the second LED light source 200', and a terminal portion 1150 connected to the metal pattern 1155 may be disposed on an upper surface of the circuit board 1100.

The circuit board 1100 may be, for example, an FR4-type printed circuit board (PCB), and may include an organic resin containing epoxy, triazine, silicon, polyimide, or the like, or a ceramic such as SiN, AlN, or $Al_2O_3$, or a metal and metal compounds. The circuit board 1100 may include a PCB, a metal core PCB (MCPCB), a multilayer PCB (MPCB), a flexible PCB (FPCB), a copper clad laminate (CCL), a metal CCL (MCCL), or the like.

The metal pattern 1155 may be electrically connected to the first LED light source 100' and the second LED light source 200', and may be electrically connected to an external power supply through the terminal portion 1150 to apply electrical signals to the first LED light source 100' and the second LED light source 200'. The metal pattern 1155 and the terminal portion 1150 may have a form of a conductive thin film, and may be formed of, for example, a copper foil.

A plurality of first LED light sources 100' and a plurality of second LED light sources 200' may be disposed on the circuit board 1100. Each of the first LED light source 100' and the second LED light source 200' may include an LED chip 110 (see FIG. 16) having a first conductivity-type semiconductor layer and a second conductivity-type semiconductor layer and an active layer disposed between the first conductivity-type semiconductor layer and the second conductivity-type semiconductor layer. Each of the first LED light sources 100' may include the first white light emitting device described in the above-mentioned example embodiments, and each of the second LED light sources 200' may include the second white light emitting device described in the abovementioned example embodiments.

The dam 1200 may be disposed to surround the first light sources 100' and the second light sources 200' on the circuit board 1100 to define an internal light emitting region. The dam 1200 may be disposed to protrude from an upper surface of the circuit board 1100 and may have a ring shape. However, shapes of the circuit board 1100 and the dam 1200 are not limited to a rectangular shape and a circular shape, respectively, but may be formed of other shapes. Therefore, dispositions of the first light sources 100' and the second light sources 200' may be variously modified. In addition, in some example embodiments, the dam 1200 may be omitted.

The encapsulation portion 1300 may fill an inner portion of a space partitioned by the dam 1200 and cover the first LED light sources 100' and the second LED light sources 200'. The encapsulation portion 1300 may have an upwardly convex dome shape in order to adjust a directivity angle of light emitted outwardly, but is not limited thereto. The encapsulation portion 1300 may be formed of a light transmissive material so that light emitted from the first LED light sources 100' and the second LED light sources 200' may travel outwardly. The light transmissive material may be, for example, a resin such as silicone or epoxy. The encapsulation portion 1300 may be formed by injecting a resin onto the circuit board 1100 and then hardening the resin in a manner such as heating, light irradiation, or time lapse. In some example embodiments, the encapsulation portion 1300 may also include a light reflective material in order to diffuse the light emitted outwardly. The light reflective material may be, for example, white powder particles such as $SiO_2$, $TiO_2$, or $Al_2O_3$. However, in some example embodiments, the encapsulation portion 1300 may be omitted, and each of the first LED light sources 100' and the second LED light sources 200' may include a lens.

Figure 16:
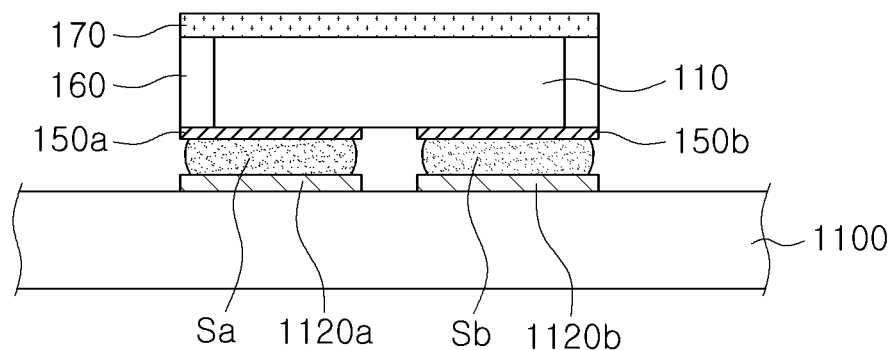
FIG. 16 is a side cross-sectional view illustrating a white light emitting device in the LED lighting apparatus of FIG. 14.

The first LED light sources 100' may be implemented in general package structures according to the one or more embodiments, but may also be implemented in a form of a chip scale package, as illustrated in FIG. 16.

Referring to FIG. 16, each of the first LED light sources 100' according to the one or more embodiments may include a blue LED chip 110 emitting blue light, a first electrode 150*a* and a second electrode 150*b* disposed on a lower surface of the blue LED chip 110, a reflection layer 160 surrounding one or more side surfaces of the blue LED chip 110, and a wavelength conversion portion 170 disposed on an upper surface of the blue LED chip 110.

The first electrode 150*a* and the second electrode 150*b* may be formed of a conductive material, and be electrically connected to a first electrode pattern 1120*a* and a second electrode pattern 1120*b* of the circuit board 1100 through a first bump Sa and a second bump Sb, respectively. The reflection layer 160 may reflect light emitted from the blue LED chip 110 in a lateral direction to direct the light in an upward direction. The reflection layer 160 may include a light reflective material, and may include, for example, a white powder such as $SiO_2$, $TiO_2$, or $Al_2O_3$.

The wavelength conversion portion 170 may include the first wavelength conversion material and the second wavelength conversion material converting a wavelength of a portion of the blue light emitted from the blue LED chip 110 to other wavelengths, similar to the wavelength conversion portions 150A according to the one or more embodiments described above.

Figure 17:
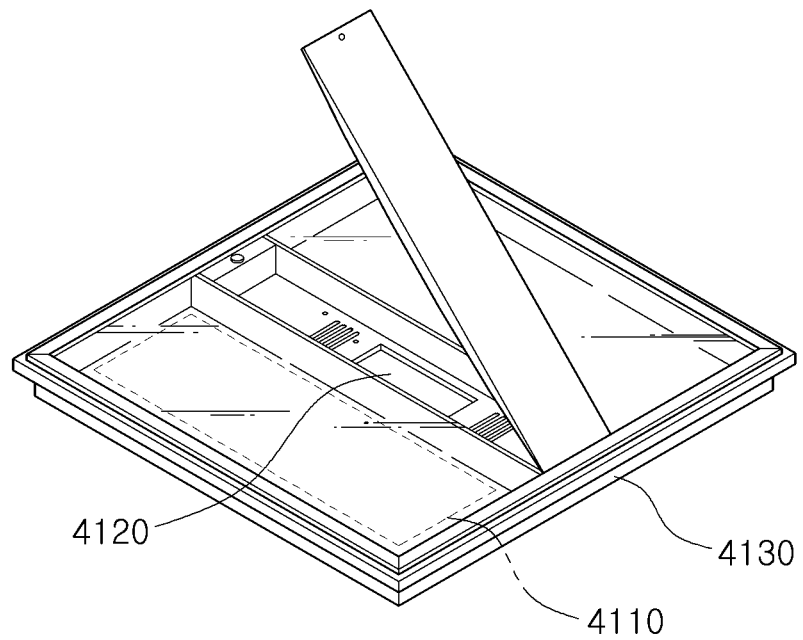
FIG. 17 is a schematic perspective view illustrating a flat panel-type lighting apparatus according to an example embodiment.

FIG. 17 is a schematic perspective view illustrating a flat panel-type lighting apparatus according to an example embodiment.

Referring to FIG. 17, a flat panel-type lighting apparatus 4100 may include a light source module 4110, a power supply device 4120, and a housing 4130. The power supply device 4120 may include a driving control unit.

The light source module 4110 may include a light source array, and may be formed to have a planar shape as a whole. A light source constituting the light source module 4110 may be configured to include the white light emitting devices 100 and 100A illustrated in FIGS. 1 and 5 or the light source module 4110 may be implemented as the LED module 1000 illustrated in FIG. 14.

The power supply device 4120 may be configured to supply power to the light source module 4110. The housing 4130 may have an accommodation space formed to accommodate the light source module 4110 and the power supply device 4120 therein, and may be formed in a hexahedral shape in which one side surface is opened, but is not limited thereto. The light source module 4110 may be disposed to emit light to the opened one side surface of the housing 4130. In addition, at least some phosphors of wavelength conversion materials implemented in the white light emitting device may be disposed on components (for example, a light guide plate, a diffusion plate, and a lens) of the lighting apparatus 4100 other than the white light emitting device.

Figure 18:
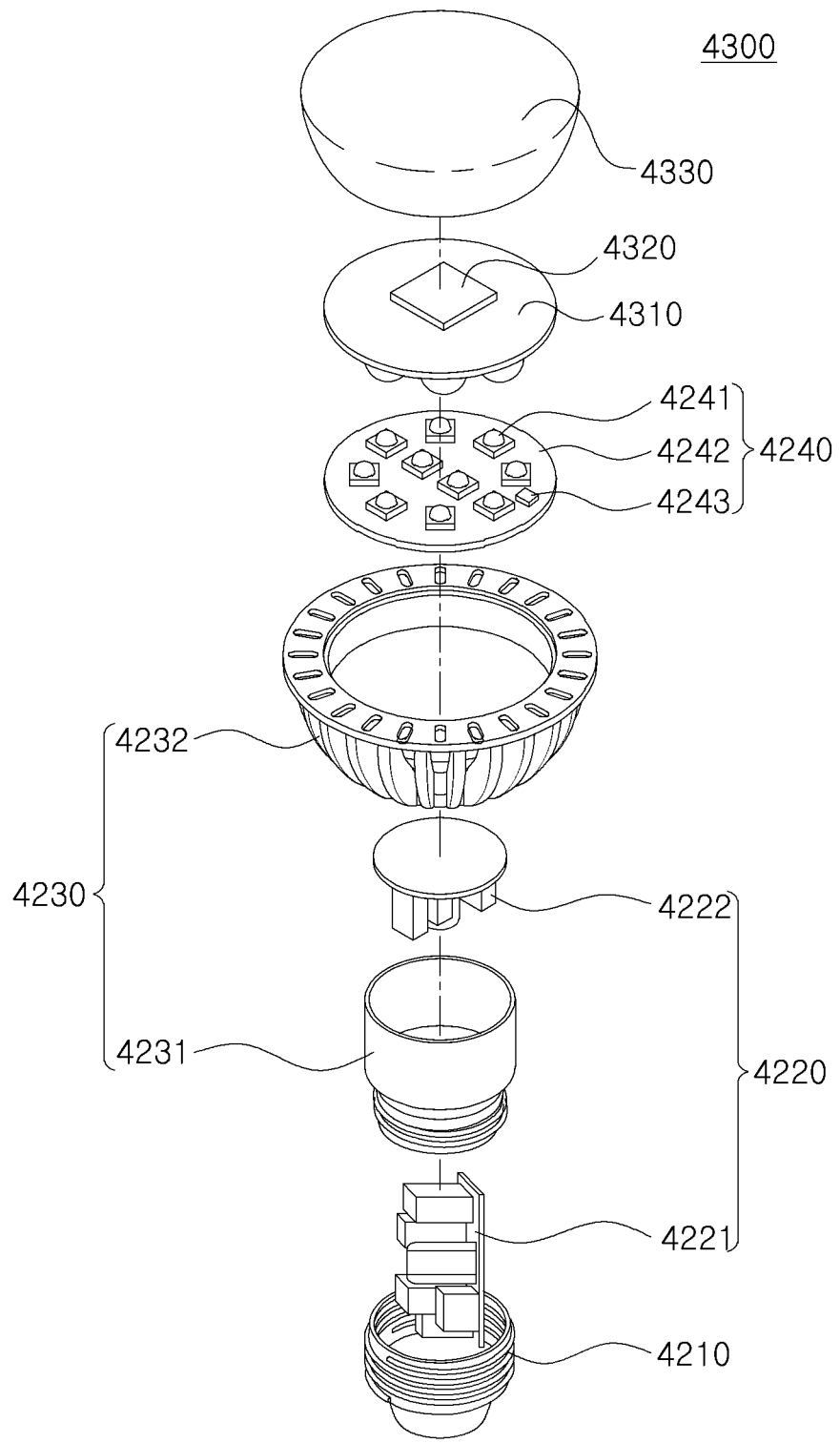
FIG. 18 is an exploded perspective view illustrating a bulb-type lighting apparatus according to an example embodiment.

FIG. 18 is an exploded perspective view illustrating a bulb-type lighting apparatus according to an example embodiment.

Referring to FIG. 18, the bulb-type lighting apparatus 4300 may include a socket 4210, a power supply portion 4220, a heat dissipation unit 4230, a light source module 4240, and a lens-type optical portion 4330.

The socket 4210 may be configured to be replaceable with an existing lighting apparatus. Power supplied to the bulb-type lighting apparatus 4300 may be applied to the bulb-type lighting apparatus 4300 through the socket 4210. As illustrated in FIG. 18, the power supply portion 4220 may be divided into a first power supply portion 4221 and a second power supply portion 4222, and assembled. The heat dissipation portion 4230 may include an internal dissipation portion 4231 and an external dissipation portion 4232. The internal dissipation portion 4231 may be directly connected to the light source module 4240 and/or the power supply portion 4220 and receive heat generated by the light source module 4240 and/or the power supply portion 4420. The heat received by the internal dissipation portion 4231 may be may be transferred to the external heat dissipation portion 4232, and released to the outside. The lens-type optical portion 4330 may be configured to evenly disperse light emitted by the light source module 4240.

The light source module 4240 may receive power supplied from the power supply portion 4220 and emit light to the lens-type optical portion 4330. The light source module 4240 may include one or more light sources 4241, a circuit board 4242, and a controller 4243. The controller 4243 may store driving information of the light sources 4241. Each light source 4241 may be configured to include the white light emitting devices 100 according to the one or more embodiments of the disclosure.

The bulb-type lighting apparatus 4300 according to an example embodiment may further include a reflection plate 4310 disposed above the light source module 4240. The reflection plate 4310 may evenly spread light from the light source in lateral and rearward directions to decrease glare.

A communications module 4320 may be mounted on the reflection plate 4310, and home-network communications may be implemented through the communications module 4320. For example, the communications module 4320 may be a wireless communications module using Zigbee, wireless fidelity (WiFi), or light fidelity (LiFi), and may perform control of lighting installed inside and outside the home, such as turn-on/off of the bulb-type lighting apparatus or adjustment of brightness through a smartphone or a wireless controller. In addition, electronic products and a vehicle system inside and outside the home, such as a television (TV), a refrigerator, an air conditioner, a door lock, and an automobile may be controlled using a LiFi communications module that uses a visible wavelength of the bulb-type lighting apparatus installed inside and outside the home. The reflection plate 4310 and the communications module 4320 may be covered by the lens-shaped optical portion 4330.

According to the one or more example embodiments, a white light emitting device and an LED lighting apparatus including the same that is capable of adjusting the secretion of melatonin hormone involved in a human biorhythm by adjusting a spectrum in a band of about 465 nm to 495 nm in order to optimize circadian rhythms may be provided.

While example embodiments have been illustrated and described above, it will be apparent to those skilled in the art that various modifications, substitutions and improvements could be made without departing from the scope of the present disclosure as defined by the appended claims.

What is claimed is:

1. A white light emitting device comprising:
   a blue light emitting diode configured to emit blue light having a peak wavelength in a first range of 440 nm to 455 nm;
   a first wavelength conversion material that, based on being excited by the blue light having the peak wavelength in the first range of 440 nm to 455 nm, emits first light having a peak wavelength in a second range of 535 nm to 550 nm and a full width at half maximum (FWHM) of 60 nm or less; and
   a second wavelength conversion material that, based on being excited by the blue light having the peak wavelength in the first range of 440 nm to 455 nm, emits second light having a peak wavelength in a third range of 620 nm to 660 nm,
   wherein a melanopic photopic ratio of white light emitted from the white light emitting device is 0.65 or less, and a color rendering index (CRI) of the white light is 80 or more, and
   wherein a correlated color temperature (CCT) of the white light is in a range of 1800 K to 4200 K
   wherein the melanopic photopic ratio of the white light is in a range of 0.1 to 0.65, and
   wherein, in a spectrum of the white light, an integral value in a band of 440 nm to 460 nm is in a range of 50% to 65% of an integral value in a band of 380 nm to 500 nm.

2. The white light emitting device of claim 1, wherein, in a spectrum of the first light, an intensity of the first light at 480 nm is 2% or less of a peak intensity of the first light.

3. The white light emitting device of claim 1, wherein the first wavelength conversion material comprises a β-SiAlON phosphor.

4. The white light emitting device of claim 1, wherein the first wavelength conversion material comprises at least one quantum dot selected from among indium phosphide/zinc sulfide (InP/ZnS), indium phosphide/zinc selenide (InP/ZnSe), cadmium selenide/cadmium sulfide (CdSe/CdS), cadmium sulfide/zinc sulfide (CdSe/ZnS), phosphate-buffered saline/zinc sulfide (PbS/ZnS), indium phosphide/zinc selenide/zinc sulfide (InP/ZnSe/ZnS), indium phosphide/gallium phosphide/zinc sulfide (InP/GaP/ZnS).

5. The white light emitting device of claim 1, wherein the second wavelength conversion material comprises at least one red phosphor selected from among $(Sr,Ca)AlSiN_3:Eu^{2+}$, $CaAlSiN_3:Eu^{2+}$, and $K_xSiF_y:Mn^{4+}$ (where, $2 \leq x \leq 3$ and $4 \leq y \leq 7$).

6. The white light emitting device of claim 1, wherein the second light emitted from the second wavelength conversion material has the FWHM of 70 nm or more.

7. The white light emitting device of claim 1, wherein, in the spectrum of the white light, an integral value in a band of 480 nm to 500 nm is in a range of 26% or less of an integral value in a band of 540 nm to 560 nm.

8. The white light emitting device of claim 1, wherein the CRI of the white light is 85 or more.

9. A white light emitting device comprising:
   a blue light emitting diode configured to emit blue light having a peak wavelength in a first range of 440 nm to 455 nm; and
   a wavelength conversion portion configured to convert a first portion of the blue light and combine the converted first portion of the blue light with a second portion of the blue light to provide white light,
   wherein the wavelength conversion portion comprises:
      a first wavelength conversion material, based on being excited by the blue light having the peak wavelength in the first range of 440 nm to 455 nm, that emits first light having a peak wavelength in a second range of 535 nm to 550 nm, and
      a second wavelength conversion material, based on being excited by the blue light having the peak wavelength in the first range of 440 nm to 455 nm, that emits second light having a peak wavelength in a third range of 620 nm to 660 nm,
   wherein, in a spectrum of the first light, an intensity of the first light at 480 nm is 2% or less of a peak intensity of the first light,
   wherein a color rendering index (CRI) of the white light is 80 or more,
   wherein a correlated color temperature (CCT) of the white light is in a range of 1800 K to 4200 K
   wherein the melanopic photopic ratio of the white light is in a range of 0.1 to 0.65, and
   wherein, in a spectrum of the white light, an integral value in a band of 440 nm to 460 nm is in a range of 50% to 65% of an integral value in a band of 380 nm to 500 nm.

10. The white light emitting device of claim 9, wherein the first wavelength conversion material comprises at least one from among a β-SiAlON phosphor and a quantum dot.

11. The white light emitting device of claim 9, wherein a correlated color temperature (CCT) of the white light is in a range of 2500 K to 3200 K, and the melanopic photopic ratio of the white light is in a range of 0.3 to 0.5.

12. The white light emitting device of claim 9, wherein a correlated color temperature (CCT) of the white light is in a range of 3200 K to 4200 K, and
   the melanopic photopic ratio of the white light is in a range of 0.40 to 0.65.

13. A white light emitting device comprising:
   a blue light emitting diode configured to emit blue light having a peak wavelength in a first range of 440 nm to 455 nm;
   a first wavelength conversion material, based on being excited by the blue light, that emits first light having a peak wavelength in a second range of 535 nm to 550 nm and an FWHM of 60 nm or less; and
   a second wavelength conversion material, based on being excited by the blue light, that emits second light having a peak wavelength in a third range of 620 nm to 660 nm,
   wherein a melanopic photopic ratio of white light emitted from the white light emitting device is 0.65 or less,
   wherein, in a spectrum of the white light, an integral value in a band of 440 nm to 460 nm is in a range of 50% to 65% of an integral value in a band of 380 nm to 500 nm, and
   wherein an integral value in a band of 480 nm to 500 nm is in a range of 26% or less of an integral value in a band of 540 nm to 560 nm.

14. The white light emitting device of claim 13, wherein a color rendering index (CRI) of the white light is 80 or more.

15. The white light emitting device of claim 13, wherein, in a spectrum of the first light, an intensity of the first light at 480 nm is 2% or less of a peak intensity of the first light.

* * * * *